US012270917B2

United States Patent
Fujiki et al.

(10) Patent No.: US 12,270,917 B2
(45) Date of Patent: Apr. 8, 2025

(54) INFORMATION PROCESSING APPARATUS, INFORMATION PROCESSING METHOD, AND PROGRAM

(71) Applicant: Sony Semiconductor Solutions Corporation, Kanagawa (JP)

(72) Inventors: Toshihiro Fujiki, Kanagawa (JP); Seiji Kobayashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 985 days.

(21) Appl. No.: 17/288,216

(22) PCT Filed: Oct. 18, 2019

(86) PCT No.: PCT/JP2019/041035
§ 371 (c)(1),
(2) Date: Apr. 23, 2021

(87) PCT Pub. No.: WO2020/090510
PCT Pub. Date: May 7, 2020

(65) Prior Publication Data
US 2021/0405212 A1 Dec. 30, 2021

(30) Foreign Application Priority Data
Nov. 1, 2018 (JP) .................................. 2018-206310

(51) Int. Cl.
*G01S 19/35* (2010.01)
*H03M 7/30* (2006.01)

(52) U.S. Cl.
CPC ............... *G01S 19/35* (2013.01); *H03M 7/70* (2013.01)

(58) Field of Classification Search
CPC .......... G01S 19/00; G01S 19/30; G01S 19/35; G01S 19/42; G01S 19/50; G01S 19/51;
(Continued)

(56) References Cited

U.S. PATENT DOCUMENTS 5,764,228 A * 6/1998 Baldwin ................. G06T 15/04
715/797
2013/0325903 A1 12/2013 Rohlf et al.
(Continued)

FOREIGN PATENT DOCUMENTS

JP     4-501473 A    3/1992
JP    2000-181345 A    6/2000
(Continued)

OTHER PUBLICATIONS

International Search Report and Written Opinion mailed on Dec. 24, 2019, received for PCT Application PCT/JP2019/041035, Filed on Oct. 18, 2019, 12 pages including English Translation.
(Continued)

*Primary Examiner* — Emily E Larocque
(74) *Attorney, Agent, or Firm* — XSENSUS LLP

(57) ABSTRACT

An information processing apparatus includes an acquisition unit that acquires first position information indicating a position of a target object in a target region and a generation unit that generates, on the basis of the first position information, second position information including area mesh information that indicates a target area mesh containing the target object and included in plural area meshes produced by dividing the target region in a first direction and a second direction such that a division number in the second direction varies for each position in the first direction in the target region and relative position information that indicates a
(Continued)

position of the target object in the target area mesh. The present technology is applicable to a transmission device and a reception device.

13 Claims, 29 Drawing Sheets

(58) Field of Classification Search
CPC ........ G01C 21/00; G01C 21/20; G01C 21/32; G09B 29/00; G09B 29/10; G06F 16/22; G06F 16/2228–2264; G06F 16/29; H03M 7/70
See application file for complete search history.

(56) References Cited

U.S. PATENT DOCUMENTS

| | | |
|---|---|---|
| 2014/0278228 A1 | 9/2014 | Agrawal et al. |
| 2016/0283515 A1 | 9/2016 | Moussalli |
| 2017/0068689 A1 | 3/2017 | Sato |

FOREIGN PATENT DOCUMENTS

| | | |
|---|---|---|
| JP | 2008-165096 A | 7/2008 |
| JP | 2010-60786 A | 3/2010 |
| JP | 2017-54183 A | 3/2017 |
| WO | 2005/001794 A1 | 1/2005 |
| WO | WO-2011004026 A2 | 1/2011 |

OTHER PUBLICATIONS

Nishioka et al., "Security Assurance System Using ICT and N-code", IPSJ SIG Technical Reports, vol. 2007, No. 30, Mar. 17, 2007, pp. 1-8.

Nishioka, "Location Information Sharing with N code", Navigation, vol. 184, Apr. 20, 2013, pp. 52-61.

\* cited by examiner

FIG. 2

| AREA MESH NUMBER (LATITUDE DIRECTION) | DIVISION IN LATITUDE DIRECTION DEG FORMAT | binary angle COORDINATE SYSTEM BA-FORMAT REAL NUMBER REPRESENTATION | binary angle COORDINATE SYSTEM BA-FORMAT BIT REPRESENTATION |
|---|---|---|---|
| 7 | [67.5, 90.0) | [0.875, 1.000) | [.111000, .111111] |
| 6 | [45.0, 67.5) | [0.750, 0.875) | [.110000, .110111] |
| 5 | [22.5, 45.0) | [0.625, 0.750) | [.101000, .101111] |
| 4 | [0.0, +22.5) | [0.500, 0.625) | [.100000, .100111] |
| 3 | [−22.5, 0.0) | [0.375, 0.500) | [.011000, .011111] |
| 2 | [−45.0, −22.5) | [0.250, 0.375) | [.010000, .010111] |
| 1 | [−67.5, −45.0) | [0.125, 0.250) | [.001000, .001111] |
| 0 | [−90.0, −67.5) | [0.000, 0.125) | [.000000, .000111] |

FIG.9

| LATITUDE AREA MESH NUMBER | LATITUDE AREA MESH ORIGIN COORDINATE (DEG) | LATITUDE AREA MESH ORIGIN COORDINATE (BA) | NUMBER OF BITS OF LONGITUDE AREA MESH NUMBER | LONGITUDE AREA MESH DIVISION NUMBER |
|---|---|---|---|---|
| 0 | -90.000 | .00000 | N/A | N/A |
| 1 | -84.375 | .00001 | 2 | 4 |
| 2 | -78.750 | .00010 | 3 | 8 |
| 3 | -73.125 | .00011 | 4 | 16 |
| 4 | -67.500 | .00100 | 4 | 16 |
| 5 | -61.875 | .00101 | 4 | 16 |
| 6 | -56.250 | .00110 | 5 | 32 |
| 7 | -50.625 | .00111 | 5 | 32 |
| 8 | -45.000 | .01000 | 5 | 32 |
| 9 | -39.375 | .01001 | 5 | 32 |
| 10 | -33.750 | .01010 | 5 | 32 |
| 11 | -28.125 | .01011 | 5 | 32 |
| 12 | -22.500 | .01100 | 5 | 32 |
| 13 | -16.875 | .01101 | 5 | 32 |
| 14 | -11.250 | .01110 | 6 | 64 |
| 15 | -5.625 | .01111 | 6 | 64 |
| 16 | 0.000 | .10000 | 6 | 64 |
| 17 | 5.625 | .10001 | 6 | 64 |
| 18 | 11.250 | .10010 | 5 | 32 |
| 19 | 16.875 | .10011 | 5 | 32 |
| 20 | 22.500 | .10100 | 5 | 32 |
| 21 | 28.125 | .10101 | 5 | 32 |
| 22 | 33.750 | .10110 | 5 | 32 |
| 23 | 39.375 | .10111 | 5 | 32 |
| 24 | 45.000 | .11000 | 5 | 32 |
| 25 | 50.625 | .11001 | 5 | 32 |
| 26 | 56.250 | .11010 | 4 | 16 |
| 27 | 61.875 | .11011 | 4 | 16 |
| 28 | 67.500 | .11100 | 4 | 16 |
| 29 | 73.125 | .11101 | 3 | 8 |
| 30 | 78.750 | .11110 | 2 | 4 |
| 31 | 84.375 | .11111 | N/A | N/A |

FIG. 14

| | | Helsinki | London | Tokyo | Singapore | Sydney |
|---|---|---|---|---|---|---|
| Q61 → PROCESS IN LATITUDE DIRECTION | DEG FORMAT | 60.171854 | 51.500751 | 35.689651 | 1.286807 | -33.856742 |
| | BA FORMAT (REAL NUMBER) | 0.834288060665136 | 0.786115229129793 | 0.698275804519655 | 0.507148921489716 | 0.311906933784486 |
| | BA FORMAT (BIT) | .110101011001001 111100111 | .110010010011111 010011001 | .101100101011000 000110100 | .100000011101010 010000011 | .010011111101100 100100010 |
| | NUMBER OF BITS OF AREA MESH NUMBER | | | 5 | | |
| REFER TO AREA MESH DEFINITION TABLE Q63 | AREA MESH NUMBER | 26 (11010) | 25 (11001) | 22 (10110) | 16 (10000) | 9 (01001) |
| | RELATIVE LATITUDE COORDINATE DATA | 1011001001111100 111 | 0010011111011011 001 | 0101000010000110 100 | 0011101010010000 011 | 1111101100100100 010 |
| Q62 → PROCESS IN LONGITUDE DIRECTION | DEG FORMAT | 24.941447 | -0.124619 | 139.692092 | 103.865357 | 151.215432 |
| | BA FORMAT (REAL NUMBER) | 0.569281786680216 | 0.499653816223144 53 | 0.888033568859103 | 0.788514852523807 | 0.920042842626571 7 |
| | BA FORMAT (BIT) | .100100010101110 0011100111 | .011111111110100 1010101000 | .111000110101011 0001010110 | .110010011101110 0000111000 | .110101011000011 1111011011 |
| | NUMBER OF BITS OF AREA MESH NUMBER → 4 | | 5 | 5 | 6 | 5 |
| | AREA MESH NUMBER | 9 (1001) | 15 (01111) | 28 (11100) | 50 (110010) | 29 (11101) |
| | RELATIVE LONGITUDE COORDINATE DATA | 0001101111000111 001 | 1111101001010101 000 | 0101010101000101 011 | 0111011100000111 000 | 0111000011111101 101 |

FIG. 24 mLat_o = 22 (10110)
mLon_o = 28 (11100)

COORDINATE CANDIDATE

Q91

| | LATITUDE AREA MESH NUMBER | ORIGIN LATITUDE | RELATIVE LATITUDE COORDINATE DATA (19 bit) | ABSOLUTE LATITUDE (DEG) |
|---|---|---|---|---|
| 0 | 21 | .10101 | | 33.110025 |
| 1 | | | | |
| 2 | | | | |
| 3 | 22 | .10110 | 1110001011011111110 | 38.735025 |
| 4 | | | | |
| 5 | | | | |
| 6 | 23 | .10111 | | 44.360025 |
| 7 | | | | |
| 8 | | | | |

Q92

| LONGITUDE AREA MESH NUMBER | ORIGIN LONGITUDE | RELATIVE LONGITUDE COORDINATE DATA (19 bit) | ABSOLUTE LONGITUDE (DEG) |
|---|---|---|---|
| 27 | .11011 | | 128.538859 |
| 28 | .11100 | 0110110011111001001 | 139.788859 |
| 29 | .11101 | | 151.038859 |
| 27 | .11011 | | 128.538859 |
| 28 | .11100 | | 139.788859 |
| 29 | .11101 | | 151.038859 |
| 27 | .11011 | | 128.538859 |
| 28 | .11100 | | 139.788859 |
| 29 | .11101 | | 151.038859 |

Q93

| DISTANCE FROM RECEIVER [km] | SHORTEST |
|---|---|
| 1029.5 | |
| 260.0 | ● |
| 1104.2 | |
| 1029.8 | |
| 368.9 | |
| 1099.6 | |
| 1354.7 | |
| 992.4 | |
| 1404.2 | |

⇒ TRANSMISSION COORDINATES: (33.11025, 139.788859)

FIG.26

| LATITUDE AREA MESH NUMBER | LATITUDE AREA MESH ORIGIN COORDINATE (DEG) | LATITUDE AREA MESH ORIGIN COORDINATE (BA) | NUMBER OF BITS OF LONGITUDE AREA MESH NUMBER | LONGITUDE AREA MESH DIVISION NUMBER |
|---|---|---|---|---|
| 0 | -90.000 | .00000 | N/A | N/A |
| 1 | -84.375 | .00001 | 3 | 8 |
| 2 | -78.750 | .00010 | 4 | 16 |
| 3 | -73.125 | .00011 | 4 | 16 |
| 4 | -67.500 | .00100 | 5 | 32 |
| 5 | -61.875 | .00101 | 5 | 32 |
| 6 | -56.250 | .00110 | 5 | 32 |
| 7 | -50.625 | .00111 | 5 | 32 |
| 8 | -45.000 | .01000 | 6 | 64 |
| 9 | -39.375 | .01001 | 6 | 64 |
| 10 | -33.750 | .01010 | 6 | 64 |
| 11 | -28.125 | .01011 | 6 | 64 |
| 12 | -22.500 | .01100 | 6 | 64 |
| 13 | -16.875 | .01101 | 6 | 64 |
| 14 | -11.250 | .01110 | 6 | 64 |
| 15 | -5.625 | .01111 | 6 | 64 |
| 16 | 0.000 | .10000 | 6 | 64 |
| 17 | 5.625 | .10001 | 6 | 64 |
| 18 | 11.250 | .10010 | 6 | 64 |
| 19 | 16.875 | .10011 | 6 | 64 |
| 20 | 22.500 | .10100 | 6 | 64 |
| 21 | 28.125 | .10101 | 6 | 64 |
| 22 | 33.750 | .10110 | 6 | 64 |
| 23 | 39.375 | .10111 | 6 | 64 |
| 24 | 45.000 | .11000 | 5 | 32 |
| 25 | 50.625 | .11001 | 5 | 32 |
| 26 | 56.250 | .11010 | 5 | 32 |
| 27 | 61.875 | .11011 | 5 | 32 |
| 28 | 67.500 | .11100 | 4 | 16 |
| 29 | 73.125 | .11101 | 4 | 16 |
| 30 | 78.750 | .11110 | 3 | 8 |
| 31 | 84.375 | .11111 | N/A | N/A |

FIG.28

| LATITUDE AREA MESH NUMBER | LATITUDE AREA MESH ORIGIN COORDINATE (DEG) | LATITUDE AREA MESH ORIGIN COORDINATE (BA) | NUMBER OF BITS OF LONGITUDE AREA MESH NUMBER | LONGITUDE AREA MESH DIVISION NUMBER |
|---|---|---|---|---|
| 0 | -90.000 | .00000 | N/A | N/A |
| 1 | -84.375 | .00001 | 2 | 4 |
| 2 | -78.750 | .00010 | 3 | 8 |
| 3 | -73.125 | .00011 | 4 | 16 |
| 4 | -67.500 | .00100 | 4 | 16 |
| 5 | -61.875 | .00101 | 4 | 16 |
| 6 | -56.250 | .00110 | 5 | 32 |
| 7 | -50.625 | .00111 | 5 | 32 |
| 8 | -45.000 | .01000 | 5 | 32 |
| 9 | -39.375 | .01001 | 5 | 32 |
| 10 | -33.750 | .01010 | 5 | 32 |
| 11 | -28.125 | .01011 | 5 | 32 |
| 12 | -22.500 | .01100 | 5 | 32 |
| 13 | -16.875 | .01101 | 5 | 32 |
| 14 | -11.250 | .01110 | 5 | 32 |
| 15 | -5.625 | .01111 | 5 | 32 |
| 16 | 0.000 | .10000 | 5 | 32 |
| 17 | 5.625 | .10001 | 5 | 32 |
| 18 | 11.250 | .10010 | 5 | 32 |
| 19 | 16.875 | .10011 | 5 | 32 |
| 20 | 22.500 | .10100 | 5 | 32 |
| 21 | 28.125 | .10101 | 5 | 32 |
| 22 | 33.750 | .10110 | 5 | 32 |
| 23 | 39.375 | .10111 | 5 | 32 |
| 24 | 45.000 | .11000 | 5 | 32 |
| 25 | 50.625 | .11001 | 5 | 32 |
| 26 | 56.250 | .11010 | 4 | 16 |
| 27 | 61.875 | .11011 | 4 | 16 |
| 28 | 67.500 | .11100 | 4 | 16 |
| 29 | 73.125 | .11101 | 3 | 8 |
| 30 | 78.750 | .11110 | 2 | 4 |
| 31 | 84.375 | .11111 | N/A | N/A |

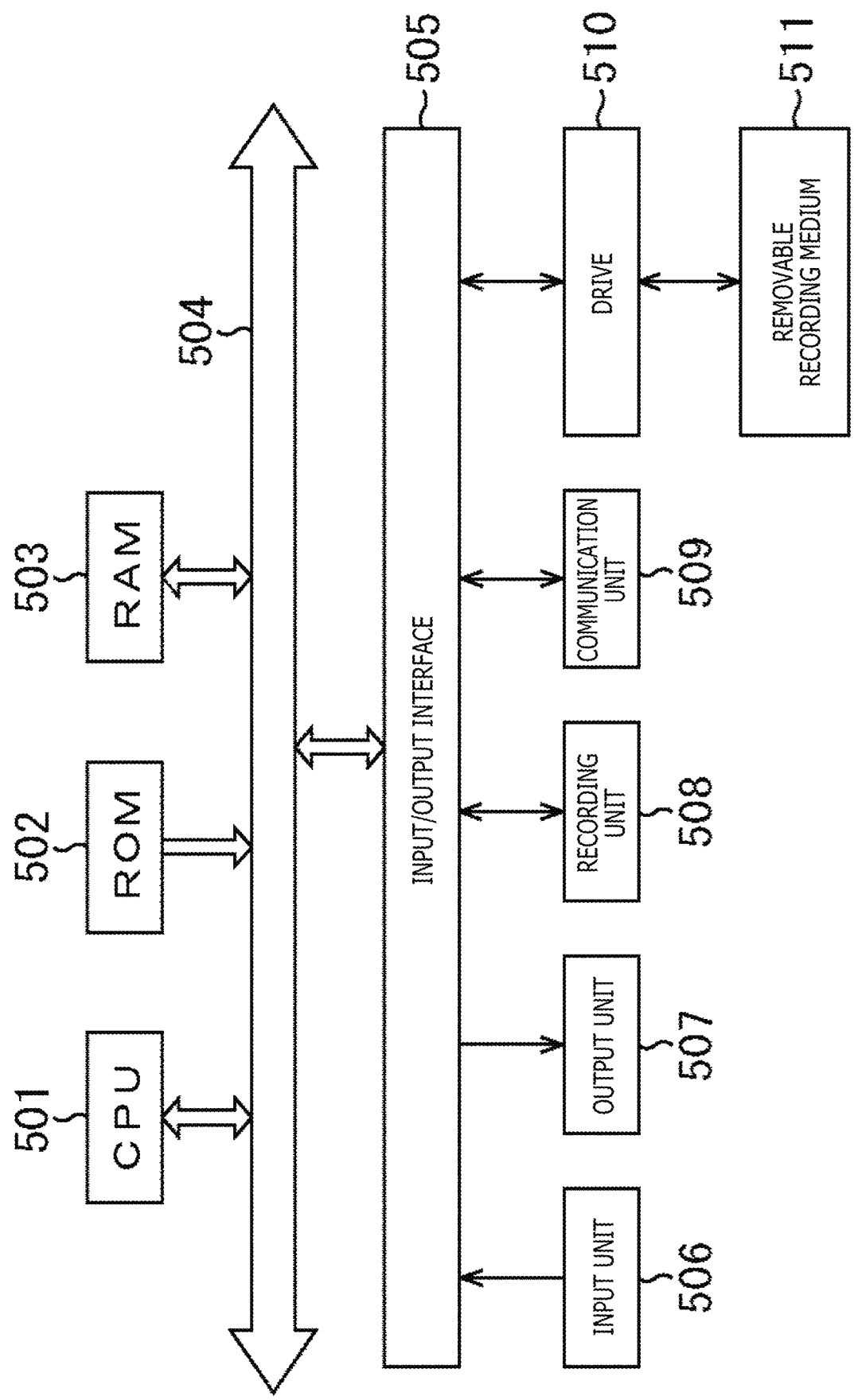

INFORMATION PROCESSING APPARATUS, INFORMATION PROCESSING METHOD, AND PROGRAM

CROSS-REFERENCE TO RELATED APPLICATIONS

The present application is based on PCT filing PCT/JP2019/041035, filed Oct. 18, 2019, which claims priority to JP 2018-206310, filed Nov. 1, 2018, the entire contents of each are incorporated herein by reference.

TECHNICAL FIELD

The present technology relates to an information processing apparatus, an information processing method, and a program, and particularly to an information processing apparatus, an information processing method, and a program each capable of reducing the number of bits of position information.

BACKGROUND ART

Conventionally, LPWA (Low Power Wide Area) communication has been known as communication which transmits and receives a small volume, such as approximately 100 bits, of payload data at a low bit rate.

For example, suppose that an application transmits and receives position information indicating a target object by using LPWA communication. In this case, it is preferred that the number of bits (bit size) of the position information be reduced as much as possible.

However, in a case where position information acquirable from GNSS (Global Navigation Satellite System), i.e., millisecond-format coordinates indicating a position, is used, 30-bit information in a latitude direction and 31-bit information in a longitude direction, i.e., position information having 61 bits in total, with accuracy of approximately 3 cm are handled.

According to such a millisecond format, only approximately 36% of a binary variable range is available. In this case, the variable area of coordinates is less likely to be used effectively. Moreover, according to the millisecond format, resolution of longitude is variable depending on latitude. In this case, an information volume of coordinates increases wastefully.

Accordingly, a technology which achieves information compression of geographic coordinates by using a geohash has been proposed, for example (e.g., see PTL 1). According to this technology, geographical coordinates are allocated to any one of rectangular regions produced by dividing a geographical range of the whole world in a hierarchical manner, and the rectangular region to which the geographical coordinates have been allocated is geohash-coded.

CITATION LIST

Patent Literature

PTL 1

Japanese Patent Laid-open No. 2017-54183

SUMMARY

Technical Problem

However, resolution of longitude is also variable depending on latitude, in the technology described in PTL 1. Accordingly, position information which achieves both necessary accuracy and sufficient reduction of the number of bits is difficult to obtain.

The present technology has been developed in consideration of the abovementioned circumstances and achieves reduction of the number of bits of position information.

Solution to Problem

An information processing apparatus according to one aspect of the present technology includes an acquisition unit that acquires first position information indicating a position of a target object in a target region, and a generation unit that generates, on the basis of the first position information, second position information including area mesh information that indicates a target area mesh containing the target object and included in plural area meshes produced by dividing the target region in a first direction and a second direction such that a division number in the second direction varies for each position in the first direction in the target region and relative position information that indicates a position of the target object in the target area mesh.

An information processing method or a program according to one aspect of the present technology includes steps of acquiring first position information indicating a position of a target object in a target region, and generating, on the basis of the first position information, second position information including area mesh information that indicates a target area mesh containing the target object and included in plural area meshes produced by dividing the target region in a first direction and a second direction such that a division number in the second direction varies for each position in the first direction in the target region and relative position information that indicates a position of the target object in the target area mesh.

According to the one aspect of the present technology, first position information indicating a position of a target object in a target region is acquired. In addition, second position information including area mesh information that indicates a target area mesh containing the target object and included in plural area meshes produced by dividing the target region in a first direction and a second direction such that a division number in the second direction varies for each position in the first direction in the target region, and relative position information that indicates a position of the target object in the target area mesh is generated on the basis of the first position information.

BRIEF DESCRIPTION OF DRAWINGS

FIG. 2 is a diagram explaining BA-format absolute coordinate data.

FIG. 9 is a diagram presenting an example of an area mesh definition table.

FIG. 14 is a diagram depicting a generation example of relative coordinate data.

FIG. 24 is a diagram depicting an example of generation of relative coordinate data and restoration of absolute coordinate data.

FIG. 26 is a diagram presenting an example of an area mesh definition table.

FIG. 28 is a diagram presenting an example of an area mesh definition table.

FIG. 29 is a diagram depicting a configuration example of a computer.

DESCRIPTION OF EMBODIMENTS

Figure 1:
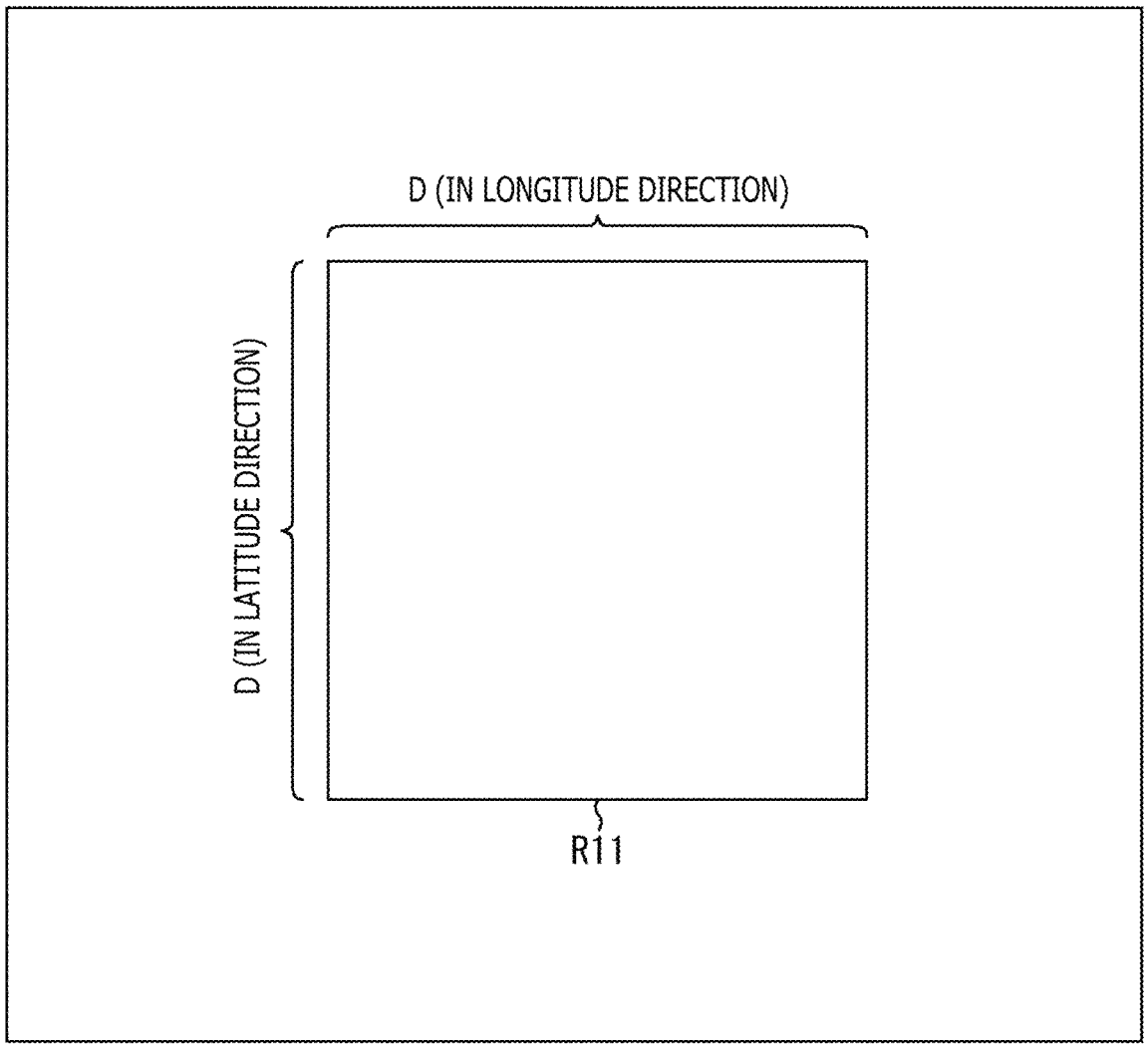
FIG. 1 is a diagram explaining an area mesh.

An embodiment to which the present technology has been applied will hereinafter be described with reference to the drawings.

First Embodiment

<Coordinate Format>

The present technology achieves reduction of the number of bits by converting position information (coordinate information) which is represented by longitude and latitude of a target region corresponding to whole districts of the world into a new GNSS coordinate format where the number of bits of data indicating longitude varies according to latitude, for example.

A GNSS coordinate format according to the present technology will first be described.

In the GNSS coordinate format of the present technology, a ground surface of the whole globe except for the vicinity of the poles is designated as a target region, and a position within the target region is represented by absolute latitude coordinate data and absolute longitude coordinate data.

The absolute latitude coordinate data here is data indicating latitude of a position on the ground surface, i.e., a coordinate in a latitude direction, and represented by an unsigned binary fixed-point angle (binary angle). Similarly, the absolute longitude coordinate data is data indicating longitude of a position on the ground surface, i.e., a coordinate in a longitude direction, and represented by an unsigned binary fixed-point angle.

Hereinafter, position information (coordinate information) represented by latitude and longitude will also be referred to as DEG-format position information, and position information including absolute latitude coordinate data and absolute longitude coordinate data will also be referred to as BA (binary angle)-format position information.

In addition, in a case where distinction between absolute latitude coordinate data and absolute longitude coordinate data is not particularly necessary, both types of data will also simply be referred to as absolute coordinate data. Moreover, described below will be an example where a position within a target region, which corresponds to a global surface constituted by an ellipsoid body, is represented by BA-format position information. However, the target region is not limited to the ground surface of the globe, and may be any region as long as the region has a curved surface such as a surface of a sphere and a part of a surface of a sphere.

According to the BA format, the ground surface is divided in the latitude direction and the longitude direction by a mesh including lines disposed under a particular rule on the ground surface. Specifically, the ground surface from the South Pole to the North Pole is divided in the latitude direction, and one round of the equator on the ground surface is divided in the longitude direction. In this case, the number of divisions in the latitude direction and the number of divisions in the longitude direction are each set to a power of 2.

Specifically, a range from 90.0 degrees south latitude (−90 degrees) to 90.0 degrees north latitude (+90.0 degrees) on the ground surface is divided into equal divisions by a division number set to a power of 2. Similarly, a range from 180.0 degrees west longitude (−180 degrees) to 180.0 degrees east longitude (+180.0) on the ground surface is divided into equal divisions by a division number set to a power of 2. Note that the division number in the longitude direction is variable according to each degree of latitude (each position in the latitude direction).

Hereinafter, each area (region) on the ground surface divided by the mesh, i.e., each region surrounded by the mesh on the ground surface, will be referred to as an area mesh.

Each of the area meshes is a substantially rectangular region as depicted in FIG. 1, for example. It is assumed here that the vertical direction in the figure corresponds to the latitude direction and that the horizontal direction in the figure corresponds to the longitude direction.

According to the example depicted in FIG. 1, a region R11 corresponds to one area mesh, and one side of the area mesh has a length D. In addition, more specifically, a length of the area mesh in the latitude direction is different from a length of the area mesh in the longitude direction. Further, the length of the area mesh in the longitude direction differs for each degree of latitude.

A lower left peak position in the figure of the area mesh, i.e., a position at the smallest longitude and latitude in the area mesh, will be defined as an area mesh origin which is an origin of the area mesh.

Note that dividing a certain region into plural regions (areas) is generally adopted to represent statistical data or the like representing divided regions.

According to the BA format, an absolute position of a target object on the ground surface is represented by an area mesh number which is information indicating an area mesh containing this target object and relative coordinate data indicating a position (relative coordinates) of the target object within that area mesh.

In other words, the absolute coordinate data includes the area mesh number and the relative coordinate data added after the area mesh number. The relative coordinate data is coordinate information indicating a relative position of a target object as viewed from the area mesh origin. Hereinafter, particularly, relative coordinate data in the latitude direction will also be referred to as relative latitude coordinate data, and relative coordinate data in the longitude direction will also be referred to as relative longitude coordinate data.

For example, the absolute latitude coordinate data includes an area mesh number in the latitude direction and relative latitude coordinate data. The area mesh number in the latitude direction is a number given to an area mesh to indicate how many area meshes are there on the ground surface before the corresponding area mesh when counted from the South Pole in plural area meshes arranged in the latitude direction. Simultaneously, the area mesh number in the latitude direction also corresponds to a binary value of a BA-format coordinate indicating a position of the area mesh origin in the latitude direction on the ground surface corresponding to the target region.

The absolute latitude coordinate data including the area mesh number in the latitude direction and the relative latitude coordinate data as described above is coordinate information which itself indicates an absolute position on the ground surface, i.e., a binary value indicating latitude represented in the BA format (unsigned binary fixed-point format).

Similarly, the absolute longitude coordinate data includes an area mesh number in the longitude direction and relative longitude coordinate data. The area mesh number in the longitude direction is a number given to an area mesh to indicate how many area meshes are there in the east on the ground surface before the corresponding area mesh when counted from a position at 180.0 degrees west longitude in plural area meshes arranged in the longitude direction. Simultaneously, the area mesh number in the longitude direction also corresponds to a binary value of a BA-format coordinate indicating a position of the area mesh origin in the longitude direction on the ground surface corresponding to the target region.

The absolute longitude coordinate data including the area mesh number in the longitude direction and the relative longitude coordinate data as described above is coordinate information which itself indicates an absolute position on the ground surface, i.e., a binary value indicating longitude represented in the BA format. Note that the coordinate indicating the position of the area mesh origin will hereinafter also simply be referred to as an area mesh origin coordinate.

A correspondence between DEG-format position information and BA-format position information will be described here in more detail.

As described above, the BA-format absolute coordinate data is data indicating such angle information as longitude and latitude which is DEG-format position information and represented by an unsigned binary fixed-point angle.

Assuming now that an open interval is represented as ( ) and that a closed interval is represented as [ ], in the case of latitude, [−90.0, +90.0) which is a range from −90.0 degrees (inclusive) to less than +90.0 degrees in the BA format corresponds to a range of [0.0, 1.0) in the BA format. Similarly, in the case of longitude, [−180.0, +180.0) which is a range from −180.0 degrees (inclusive) to less than +180.0 degrees in the BA format corresponds to a range of [0.0, 1.0) in the BA format.

Accordingly, for example, assuming that the ground surface is divided into 8 ($=2^3$) divisions in the latitude direction, respective area meshes arranged in the latitude direction have ranges as presented in FIG. 2 in a case where DEG-format latitude is represented by 6 bits in the BA format.

In FIG. 2, the column "AREA MESH NUMBER (LATITUDE DIRECTION)" contains area mesh numbers of respective area meshes in the latitude direction. For example, an area mesh number "0" indicates that the area mesh corresponding to that area mesh number is an area mesh located first from the South Pole side on the ground surface.

The column "DIVISION IN LATITUDE DIRECTION DEG FORMAT" contains ranges of the respective area meshes in the latitude direction as represented in the DEG format. For example, the range of the area mesh in the latitude direction that is an area mesh corresponding to the area mesh number "0" is a range from −90.0 degrees (inclusive) to less than −67.5 degrees as represented in the DEG format.

The column "binary angle COORDINATE SYSTEM BA-FORMAT REAL NUMBER REPRESENTATION" contains real number values (values represented by decimal numbers) in the ranges of the respective area meshes in the latitude direction as represented in the BA format, i.e., ranges in real number representation. For example, the range of the area mesh in the latitude direction that is an area mesh corresponding to the area mesh number "0" is a range from 0.000 (inclusive) to less than 0.125 in real number representation when represented in the BA format.

In addition, the column "binary angle COORDINATE SYSTEM BA-FORMAT BIT REPRESENTATION" contains binary values in the ranges of the respective area meshes in the latitude direction as represented in the BA format, i.e., ranges in bit representation. For example, the range of the area mesh in the latitude direction that is an area mesh corresponding to the area mesh number "0" is a range from 000000 to 000111 in bit representation when represented in the BA format.

Particularly, a high-order three-bit value of each of binary values indicating the ranges of the BA-format area meshes in the latitude direction, such as a high-order three-bit value "000" in "0.000000" or "0.000111", here indicates a binary value of the area mesh number of the area mesh in the latitude direction associated with the corresponding range.

Note that, it is difficult to represent a real number completely by an unsigned binary fixed-point number in the BA format. Accordingly, each of values in the BA format is an approximate value. In addition, hereinafter, particularly an area mesh number in the latitude will also be referred to as a latitude area mesh number, and particularly an area mesh number in the longitude direction will also be referred to as a longitude area mesh number.

Described next will be a structure and a role of absolute coordinate data in the BA format, such as absolute latitude coordinate data and absolute longitude coordinate data.

Figure 3:
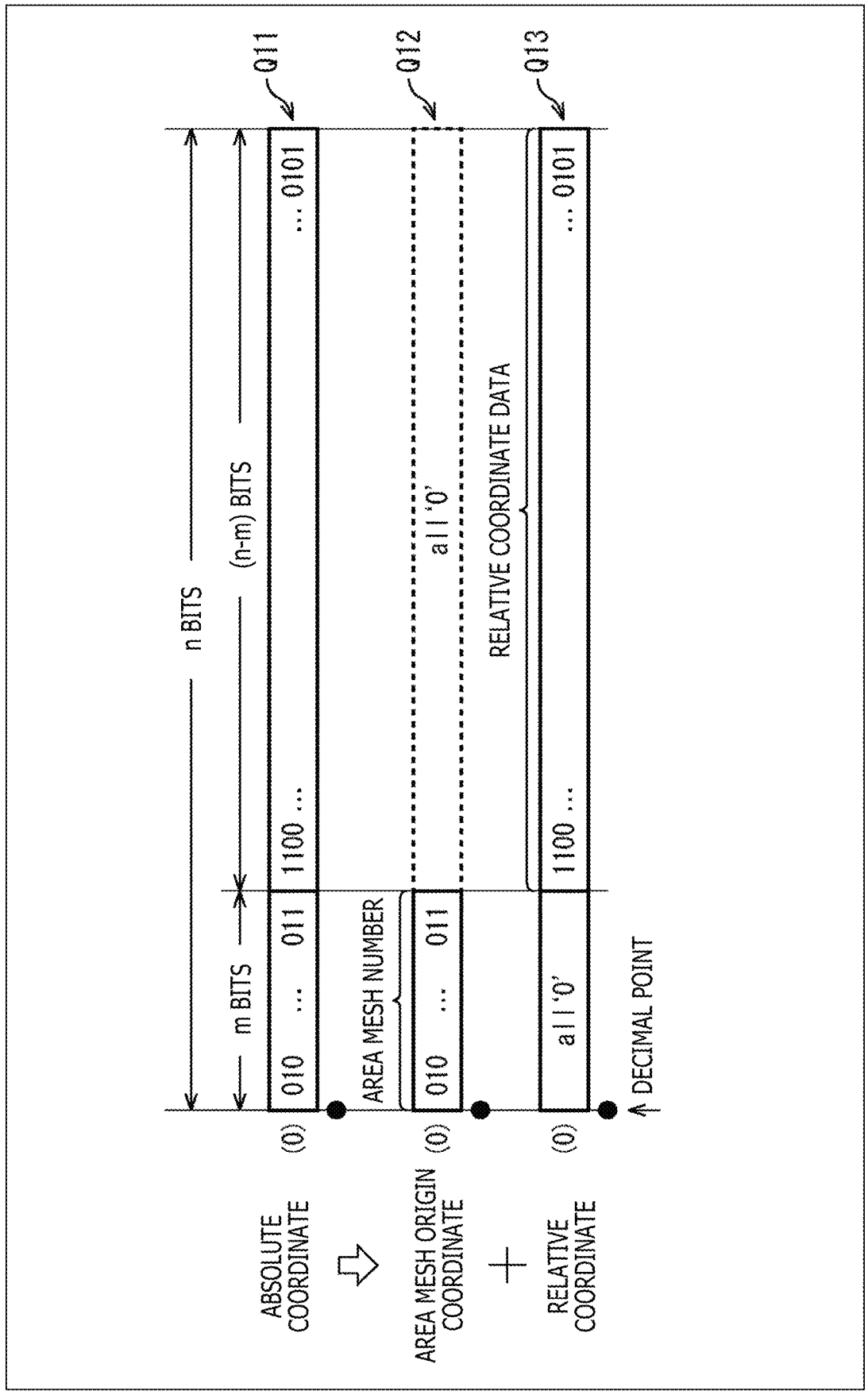
FIG. 3 is a diagram explaining BA-format absolute coordinate data.

For example, suppose that there is n-bit absolute coordinate data as indicated by an arrow Q11 in FIG. 3. This absolute coordinate data is coordinate data indicating a certain direction on the ground surface, i.e., an absolute position in the latitude direction or the longitude direction.

In addition, suppose that the number of division of the ground surface into area meshes in the direction corresponding to this absolute coordinate data (hereinafter also referred to as an area mesh division number) is $2^m$. Particularly in the BA format, the area mesh division number is always determined to become a power of 2.

According to the example depicted in FIG. 3, high-order m bits in n-bit absolute coordinate data correspond to an area mesh number, i.e., an area mesh origin coordinate, as indicated by an arrow Q12. In other words, the area mesh number in the latitude direction or the longitude direction has m bits. This number of bits m is determined by the area mesh division number.

Moreover, a real number value of the area mesh origin coordinate is obtained by dividing a real number value of the area mesh number by $2^m$.

Further, as indicated by an arrow Q13, data after the area mesh number in the n-bit absolute coordinate data, i.e., low-order (n-m)-bit data, corresponds to relative coordinate data.

In other words, the absolute coordinate data is data obtained as a sum of an area mesh origin coordinate obtained by zero-padding of (n-m) bits at the end of the area mesh number and relative coordinate data obtained by zero-padding of m bits at the head.

According to the BA-format n-bit absolute coordinate data described above, a minimum unit of an absolute coordinate (LSB (Least Significant Bit)), i.e., coordinate accuracy, is $\frac{1}{2^n}$.

Note that a correct value can be obtained in the BA format by cutting out an original bit width even in a case of an excess of the number of digits as a result of addition or subtraction of data. For example, suppose that (n+1)-bit data is obtained by calculation of n-bit absolute coordinate data. In this case, correct data indicating a calculation result can be obtained by extracting n bits of the data and designating the extracted data as absolute coordinate data. For example, even in a case where the coordinate of longitude is smaller than −180 degrees in the DEG format, absolute coordinate data automatically reflected on the side of the +180 degrees is obtained in the BA format.

In a case of conversion of latitude or longitude in the DEG format into absolute coordinate data in the BA format, it is sufficient if calculation is performed using the following conversion formulae, for example.

Specifically, for converting latitude deg, which is DEG-format latitude (where, −90.0≤deg<+90.0), for example, into BA-format n-bit absolute latitude coordinate data deg2ba_lat(n, deg), it is sufficient if a conversion formula represented by the following Equation (1) is calculated.

[Math. 1]

$$\text{deg2ba\_lat}(n, \text{deg}) = \text{floor}((90+\text{deg}) \times 2^n / 180) / 2^n - 90.0 \text{degrees} \leq \text{deg} < +90.0 \text{degrees} \quad (1)$$

Similarly, for converting longitude deg, which is DEG-format longitude (where, −180.0≤deg<+180.0), for example, into BA-format n-bit absolute longitude coordinate data deg2ba_lon(n, deg), it is sufficient if a conversion formula represented by the following Equation (2) is calculated.

[Math. 2]

$$\text{deg2ba\_lon}(n, \text{deg}) = \text{floor}((180+\text{deg}) \times 2^n / 360) / 2^n - 180.0 \text{degrees} \leq \text{deg} < +180.0 \text{degrees} \quad (2)$$

Note that floor(A) in each of Equation (1) and Equation (2) is a floor function which is a function for outputting a maximum integer not exceeding an argument A.

Conversely, for converting BA-format absolute coordinate data into DEG-format angle information, it is sufficient if calculation is performed using the following conversion formulae, for example.

Specifically, for converting absolute latitude coordinate data ba, which is BA-format absolute latitude coordinate data (where, 0≤ba<1.0), for example, into DEG-format latitude ba2deg_lat(ba), it is sufficient if a conversion formula represented by the following Equation (3) is calculated.

[Math. 3]

$$\text{ba2deg\_lat}(ba) = -90 + 180 \times ba \quad 0 \leq ba < 1.0 \quad (3)$$

Similarly, for converting absolute longitude coordinate data ba, which is BA-format absolute longitude coordinate data (where, 0≤ba<1.0), for example, into DEG-format longitude ba2deg_lon(ba), it is sufficient if a conversion formula represented by the following Equation (4) is calculated.

[Math. 4]

$$\text{ba2deg\_lon}(ba) = -180 + 360 \times ba \quad 0 \leq ba < 1.0 \quad (4)$$

<Area Mesh Division Number>

Figure 4:
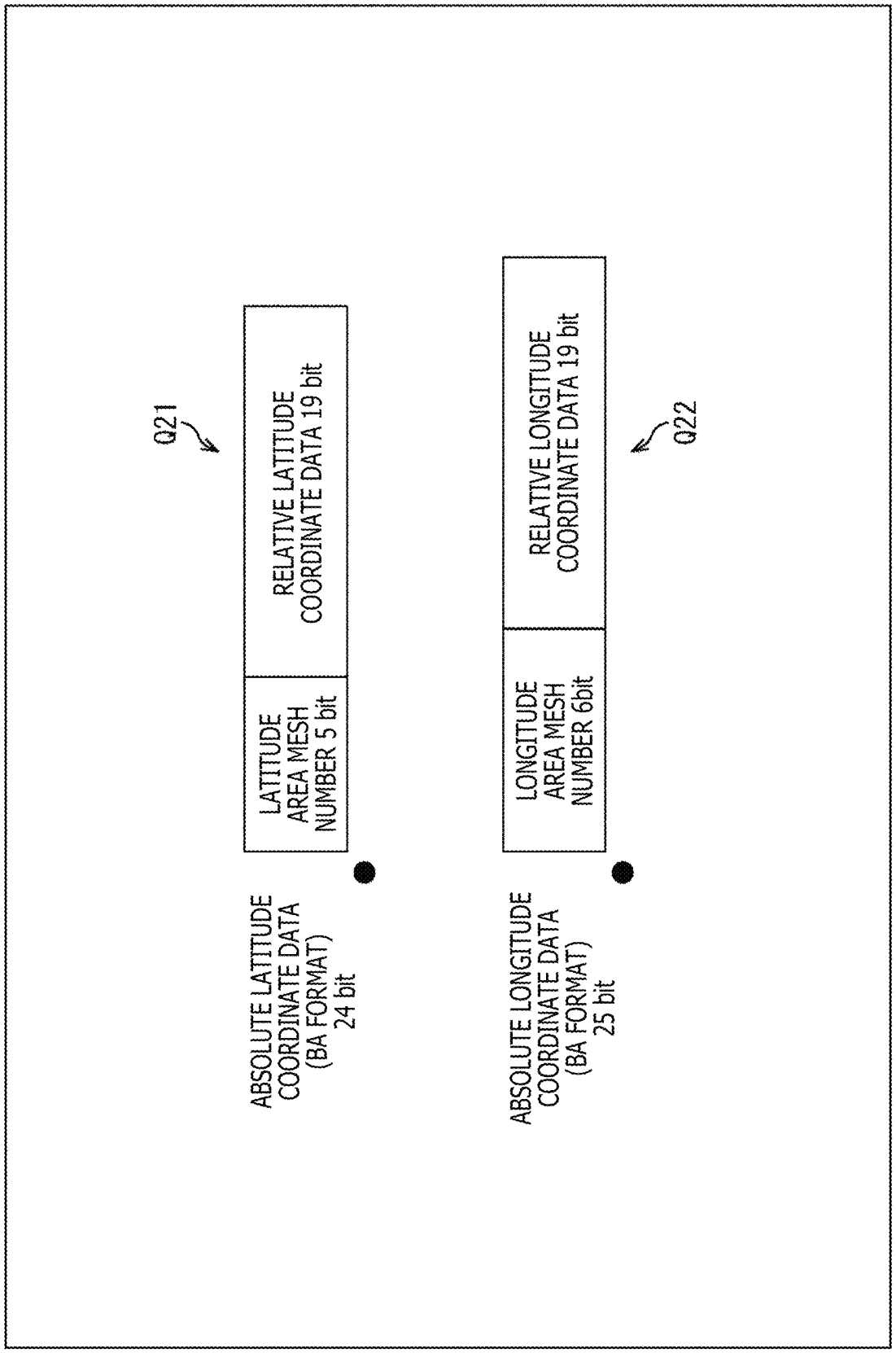
FIG. 4 is a diagram explaining BA-format absolute coordinate data.

Meanwhile, considered here will be BA-format position information including 24-bit absolute latitude coordinate data and 25-bit absolute longitude coordinate data as depicted in FIG. 4.

FIG. 4 depicts absolute latitude coordinate data in a part indicated by an arrow Q21 and absolute longitude coordinate data in a part indicated by an arrow Q22. In addition, "." included in each of these absolute latitude coordinate data and absolute longitude coordinate data represents a decimal point.

In this figure, high-order 5 bits of the absolute latitude coordinate data correspond to a latitude area mesh number, while remaining 19 bits following the latitude area mesh number correspond to relative latitude coordinate data. Thus, in this case, the area mesh division number in the latitude direction is 32. In other words, the ground surface of the target region is divided into 32 sections in the latitude direction.

On the other hand, high-order 6 bits of the absolute longitude coordinate data correspond to a longitude area mesh number, while remaining 19 bits following the longitude area mesh number correspond to relative longitude coordinate data. Accordingly, in this case, the area mesh division number in the longitude direction is 64. In other words, the ground surface of the target region is divided into 64 sections in the longitude direction.

In addition, hereinafter, particularly an area mesh division number in the latitude will also be referred to as a latitude area mesh division number, and particularly an area mesh division number in the longitude direction will also be referred to as a longitude area mesh division number.

Figure 5:
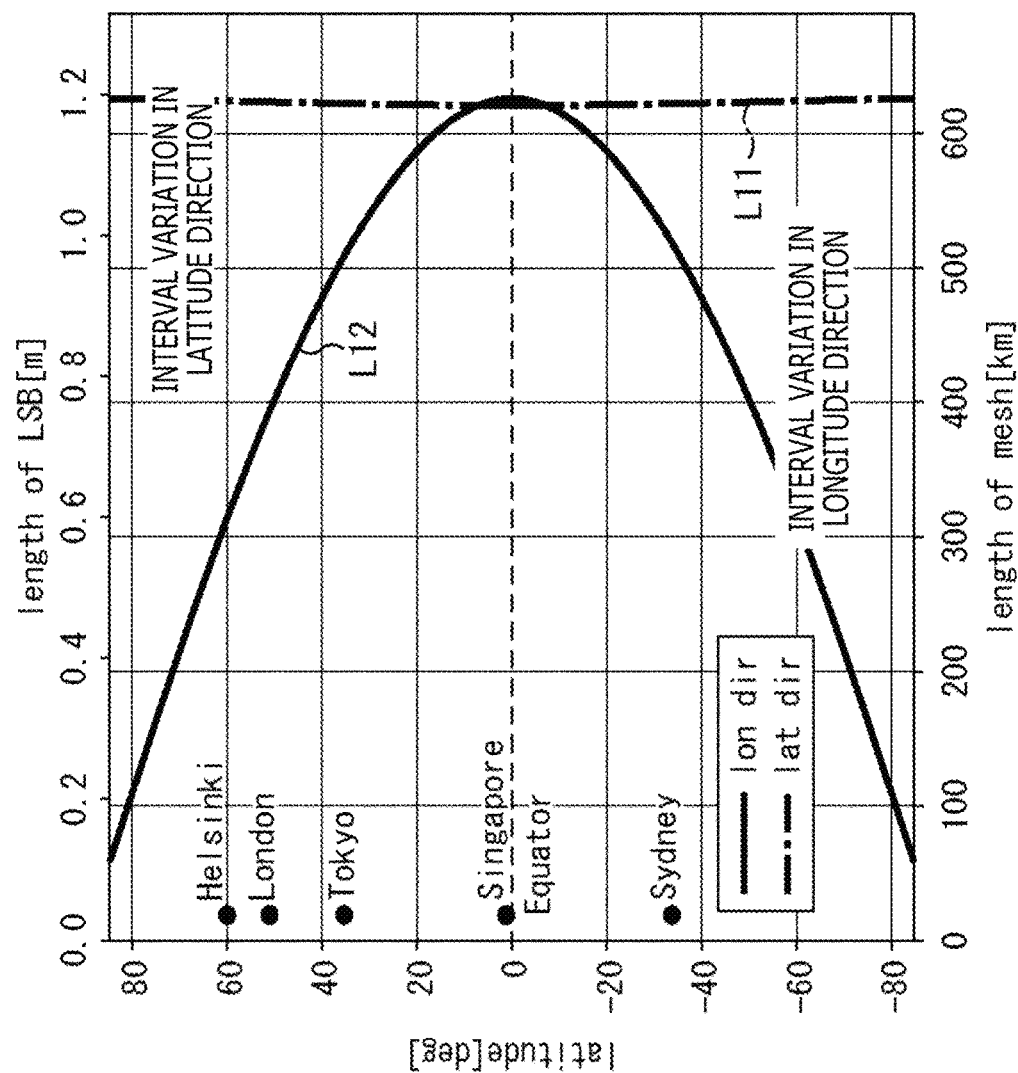
FIG. 5 is a diagram explaining a variation in a mesh interval according to latitude.

In a case where BA-format position information has the configuration depicted in FIG. 4, a mesh interval in each of the latitude direction and the longitude direction varies according to each degree of latitude in a manner depicted in FIG. 5.

Note that a vertical axis in FIG. 5 represents DEG-format latitude. Moreover, an upper horizontal axis in FIG. 5 represents an interval (length) of the ground surface per minimum unit (LSB), i.e., one bit, of absolute coordinate data constituting BA-format position information, while a lower horizontal axis in FIG. 5 represents a mesh interval, i.e., the length D of one side of each area mesh described above. The interval of the ground surface per minimum unit of the absolute coordinate data and the mesh interval have a proportional relation with one another.

In FIG. 5, a curved line L11 represents a mesh interval in the latitude direction and an interval of the ground surface per minimum unit of absolute latitude coordinate data, for each degree of latitude.

As apparent from the curved line L11, in the latitude direction, the mesh interval (length D) in the latitude direction is substantially constant regardless of a difference in latitude or longitude within the target region. Particularly in this example, the mesh interval in the latitude direction is approximately 620 km for each latitude. It is thus apparent that the area mesh division number may be a uniform (fixed) number in the latitude direction.

On the other hand, a curved line L12 represents a mesh interval in the longitude direction and an interval of the ground surface per minimum unit of absolute longitude coordinate data, for each degree of latitude.

As apparent from the curved line L12, in the longitude direction, the mesh interval (length D) in the longitude direction decreases as an absolute value of latitude within the target region increases, i.e., approaches the pole. For example, the mesh interval in the longitude direction is approximately 620 km near the equator (latitude: 0 degrees), but is approximately 60 km near the pole.

It is thus apparent that the interval of the absolute longitude coordinate data per minimum unit is excessively short near the pole and that an information volume (accuracy by LSB) is wasted.

Accordingly, for the longitude direction, the present technology sets a different area mesh division number in the longitude direction for each degree of latitude. In such a manner, the number of bits (size) of absolute longitude coordinate data can be reduced appropriately according to each degree of latitude while minimum required accuracy as accuracy for the interval per minimum unit, i.e., accuracy by LSB, is secured. Moreover, use efficiency of a variable range can be improved by adopting the BA format, in comparison with the DEG format.

A specific example of a method for determining the area mesh division number in the longitude direction will be described here.

According to the present technology, for example, the longitude area mesh division number (hereinafter also described as MI) near the equator where the mesh interval in the longitude direction becomes longest is first determined, and a longitude area mesh division number M at a position of each degree of latitude is temporarily set to MI.

Then, the longitude area mesh division number M is halved until the mesh interval in the longitude direction exceeds a predetermined threshold TH (>2D) determined beforehand, for each degree of latitude. The longitude area mesh division number M at the time when the mesh interval in the longitude direction exceeds the threshold TH is designated as the final longitude area mesh division number M.

More specifically, the longitude area mesh division number of area meshes of a processing target is halved until the longitudinal intervals of two meshes that is arranged in the latitude direction and that constitutes area meshes of the processing target both become longer than the threshold TH.

Figure 6:
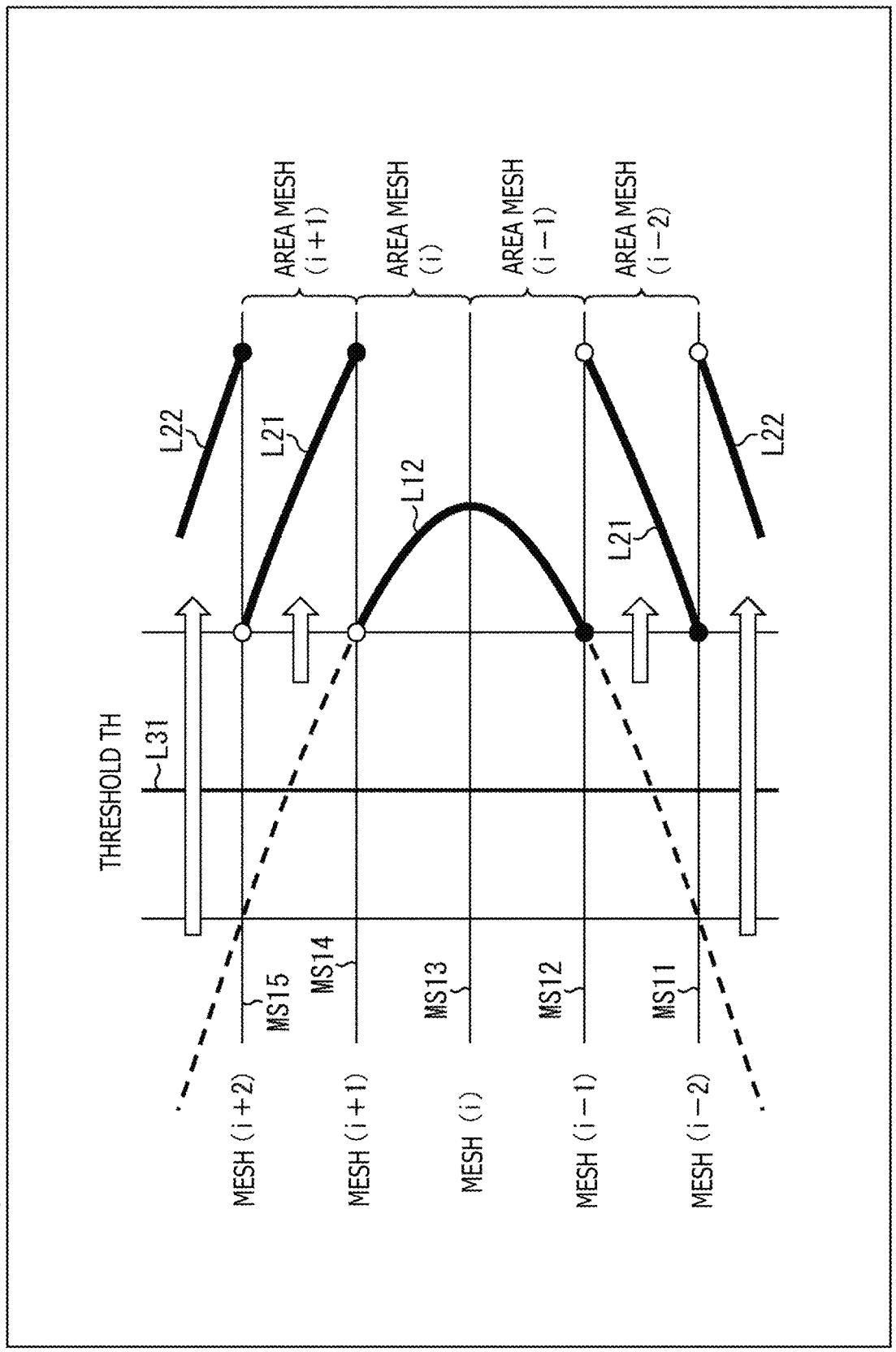
FIG. 6 is a diagram explaining a longitude area mesh division number according to latitude.

For example, as depicted in FIG. 6, it is assumed that the ground surface as the target region is divided by a mesh and that the longitude area mesh division number MI is set to 64. Note that parts in FIG. 6 which correspond to associated parts in FIG. 5 are given identical reference signs, and description of these parts will be omitted as appropriate.

In FIG. 6, a vertical direction in the figure represents the latitude direction, while a horizontal direction in the figure represents a mesh interval in the longitude direction.

Straight lines MS11 to MS15 here represent meshes (i−2) to (i+2) dividing the ground surface as a target region, in the latitude direction. Particularly here, an area mesh provided between a mesh I (where, i−2≤I≤i+2) and a mesh (I+1) in the latitude direction will be expressed as an area mesh I (where, i−2≤I≤i+2).

Moreover, a curved line L12 represents a mesh interval in the longitude direction at each degree of latitude when the longitude area mesh division number is 64. Similarly, a curved line L21 represents a mesh interval in the longitude direction at each degree of latitude when the longitude area mesh division number is 32, while a curved line L22 represents a mesh interval in the longitude direction at each degree of latitude when the longitude area mesh division number is set to 16. In addition, a straight line L31 represents a threshold TH.

In the example depicted in FIG. 6, the longitude area mesh division number MI near the equator is 64. For example, when attention is focused on the area mesh i here, the longitude area mesh division number M of the area mesh i is first set as M=MI=64.

As apparent from the curved line L12, in a case where the longitude area mesh division number M of the area mesh i is 64, both an interval of the mesh i in the longitude direction and an interval of the mesh (i+1) in the longitude direction are longer than the threshold TH. Accordingly, the longitude area mesh division number M of the area mesh i is set to 64.

On the other hand, for example, attention is focused on the area mesh (i+1). In this case, the longitude area mesh division number M of the area mesh (i+1) is also first set as M=MI=64.

As apparent from the curved line L12, in a case where the longitude area mesh division number M of the area mesh (i+1) is 64, the mesh interval of the mesh (i+1) in the longitude direction is longer than the threshold TH, but the interval of the mesh (i+2) in the longitude direction is the threshold TH or shorter.

Accordingly, the longitude area mesh division number M of the area mesh (i+1) is halved. As a result, the longitude area mesh division number M of the area mesh (i+1) becomes 32. In this case, as apparent from the curved line L21, both the interval of the mesh (i+1) in the longitude direction and the interval of the mesh (i+2) in the longitude direction are longer than the threshold TH. Accordingly, the final longitude area mesh division number M of the area mesh (i+1) is set to 32.

The longitude area mesh division number M is determined in a similar manner for all of the other area meshes arranged in the latitude direction. For example, the longitude area mesh division number M of the area mesh (i+2) is set to 16.

When the longitude area mesh division number M is determined for each degree of latitude by the processing described above, the mesh interval in the longitude direction is always longer than the threshold TH for the area mesh located at any degree of latitude. Accordingly, a wasteful decrease in the mesh interval in the longitude direction is avoidable by appropriately determining the longitude area mesh division number M according to each degree of latitude. As a result, the number of bits of absolute longitude coordinate data can be reduced appropriately.

Figure 7:
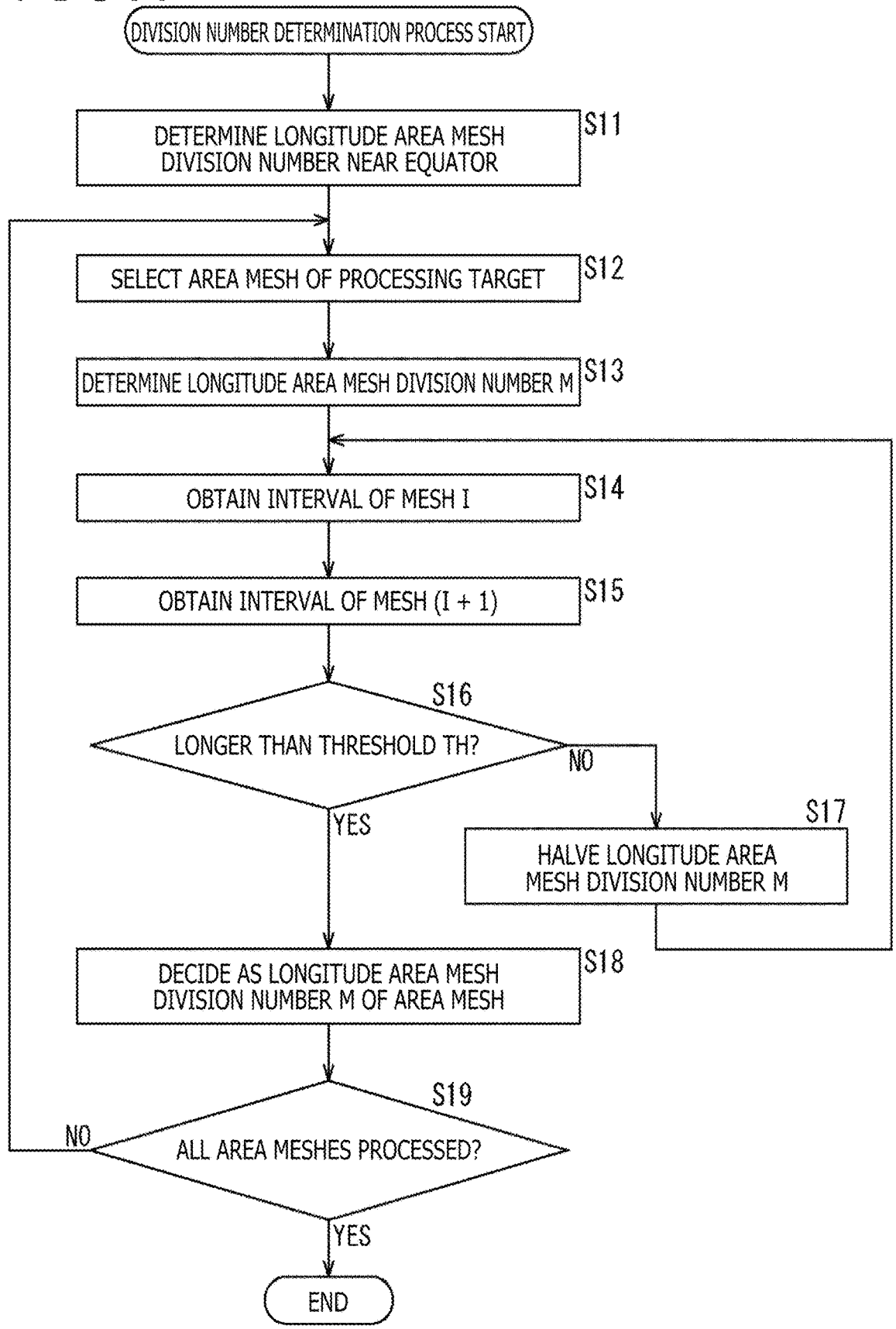
FIG. 7 is a flowchart explaining a division number determination process.

More specifically, in a case where the longitude area mesh division number is determined for each degree of latitude in the manner described above, a division number determination process presented in FIG. 7 is performed. The division number determination process will thus be described below with reference to a flowchart in FIG. 7.

In step S11, the longitude area mesh division number MI near the equator is determined. For example, in the example depicted in FIG. 6, the longitude area mesh division number MI is set to 64.

In step S12, one of plural area meshes arranged in the latitude direction is selected as an area mesh I corresponding to a processing target. It is assumed here that the area mesh I is an area mesh having a latitude area mesh number I.

In step S13, the longitude area mesh division number M is determined for the area mesh I corresponding to the processing target. The value of the longitude area mesh division number MI is designated here as the longitude area mesh division number M without any change.

In step S14, a mesh interval of a mesh I constituting the area mesh I as the processing target in the longitude direction for the longitude area mesh division number M, i.e., a length of the area mesh I as the processing target in the longitude direction, is obtained. The mesh I here is a mesh passing through an origin of the area mesh I. The mesh interval in the longitude direction is obtained on the basis of the longitude area mesh division number M and the latitude area mesh number of the area mesh I.

In step S15, the longitudinal mesh interval of a mesh (I+1) constituting the area mesh I as the processing target in a case where the longitude area mesh division number is M is obtained. The mesh (I+1) is a mesh not passing through the origin of the area mesh I. In step S15, the mesh interval in the longitude direction is obtained in a manner similar to the manner of step S14.

In step S16, it is determined whether or not the interval of the mesh I in the longitude direction obtained in step S14 and the interval of the mesh (I+1) in the longitude direction obtained in step S15 are both longer than the threshold TH.

In a case of a determination that both the intervals are the threshold TH or shorter in step S16, the process proceeds to step S17.

In step S17, the longitude area mesh division number M of the area mesh I corresponding to the processing target is halved. The value of the halved longitude area mesh division number obtained in such a manner, i.e., M/2, is designated as the new longitude area mesh division number M of the area mesh I that has been updated. After update of the longitude area mesh division number M, the process subsequently returns to step S14 to repeat the processing described above.

On the other hand, in a case of a determination that both the intervals are longer than the threshold TH in step S16, the value of the longitude area mesh division number M at this time is decided as the final longitude area mesh division number M of the area mesh I corresponding to the processing target, in step S18.

In step S19, whether or not processing has been completed for all of the area meshes is determined. For example, in a case where the longitude area mesh division number M is determined (decided) for all of the area meshes arranged in the latitude direction by designating each of the area meshes as the area mesh I corresponding to the processing target, it is determined in step S19 that processing has been completed for all of the area meshes.

In a case of a determination that processing is yet to be completed for all of the area meshes in step S19, the process returns to step S12 to repeat the processing described above.

On the other hand, in a case of a determination that processing has been completed for all of the area meshes in step S19, the division number determination process ends.

According to the present technology, the area mesh division number in the longitude direction is determined in the manner described above according to each position in the latitude direction. As a result, reduction of the number of bits of position information is achievable while minimum required accuracy is secured.

Figure 8:
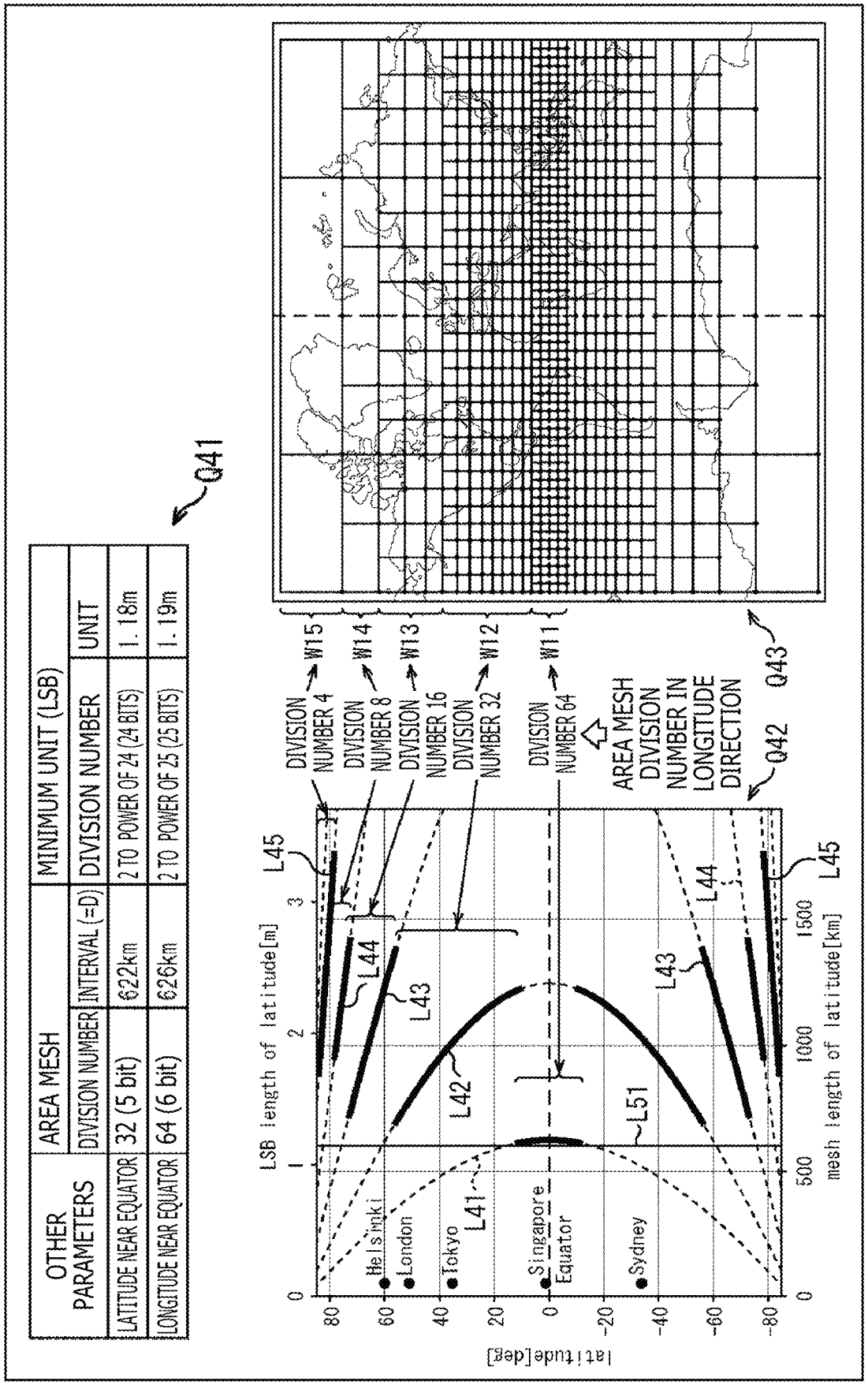
FIG. 8 is a diagram depicting an example of division into area meshes.

For example, a result presented in FIG. 8 is obtained by dividing the ground surface of the globe as an actual target region into area meshes by the area mesh division number determined by the division number determination process described with reference to FIG. 7.

In the example presented in FIG. 8, D/2<300 km and the threshold TH=600 km are set. In FIG. 8, basic parameters are presented in a part indicated by an arrow Q41, mesh intervals at respective degrees of latitude are presented in a part indicated by an arrow Q42, and respective area meshes on the ground surface are presented in a part indicated by an arrow Q43.

Specifically, in this example, as indicated by the arrow Q41, the area mesh division number in the latitude direction near the equator is 32, and the mesh interval in the latitude direction in this case is 622 km.

Moreover, absolute latitude coordinate data has 24 bits, and the division number of the ground surface as the target region in the latitude direction is $2^{24}$. Accordingly, the interval per one bit, i.e., the interval per minimum unit, of the ground surface corresponding to the target region in the latitude direction is 1.18 m.

On the other hand, the area mesh division number in the longitude direction near the equator is 64, i.e., the longitude area mesh division number MI=64 is set. In this case, the mesh interval in the longitude direction is 626 km. Moreover, absolute longitude coordinate data has 25 bits, and the division number of the ground surface as the target region in the longitude direction is $2^{25}$. Accordingly, the interval per one bit, i.e., per minimum unit, of the ground surface corresponding to the target region near the equator in the longitude direction is 1.19 m.

By determining the area mesh division number in each of the latitude direction and the longitude direction near the equator in the manner described above and performing the division number determination process presented in FIG. 7 according to the determination thus made, the longitude area mesh division number M at each degree of latitude is determined as indicated by the arrow Q42.

In the part indicated by the arrow Q42, a vertical axis represents DEG-format latitude. Moreover, in the part indicated by the arrow Q42, an upper horizontal axis in the figure represents an interval of the ground surface per minimum unit (LSB) of absolute longitude coordinate data, while a lower horizontal axis in the figure represents a mesh interval in the longitude direction.

A curved line L41 represents a mesh interval in the longitude direction at each degree of latitude in a case where the longitude area mesh division number M=64 is set, while a curved line L42 represents a mesh interval in the longitude direction at each degree of latitude in a case where the longitude area mesh division number M=32 is set.

Similarly, a curved line L43 represents a mesh interval in the longitude direction at each degree of latitude in a case where the longitude area mesh division number M=16 is set, while a curved line L44 represents a mesh interval in the longitude direction at each degree of latitude in a case where the longitude area mesh division number M=8 is set. A curved line L45 represents a mesh interval in the longitude direction at each degree of latitude in a case where the longitude area mesh division number M=4 is set. In addition, a straight line L51 represents the threshold TH=600 km.

A part expressed by a thick line in each of the curved lines L41 to L45 here indicates a range (latitude section) corresponding to the longitude area mesh division number M actually determined, and each of the mesh intervals in the longitude direction at respective degrees of latitude corresponding to the actual longitude area mesh division number M is longer than the threshold TH.

A result indicated by the arrow Q43 is obtained by dividing the ground surface of the globe corresponding to the target region into area meshes on the basis of the longitude area mesh division number M determined for each degree of latitude in the manner described above and the latitude area mesh division number "32" which is uniform for each degree of latitude.

In the part indicated by the arrow Q43, one quadrangle represents one area mesh. In this example, the latitude area mesh division number is always fixed for each degree of latitude and longitude. However, it is apparent that the longitude area mesh division number M varies for each degree of latitude.

For example, the longitude area mesh division number M is 64 in a region W11 near the equator, and the longitude area mesh division number M is 32 in a region W12 on the upper side of the region W11 in the figure. Moreover, the longitude area mesh division number M is 16 in a region W13 on the upper side of the region W12 in the figure, and the longitude area mesh division number M is 8 in a region W14 on the upper side of the region W13 in the figure.

Further, the longitude area mesh division number M is 4 in a region W15 near the pole on the upper side of the region W14 in the figure.

According to the division number determination process, as apparent from above, the longitude area mesh division number for each degree of latitude is determined such that the longitude area mesh division number M decreases with nearness to the pole, i.e., as the absolute value of the degree of latitude increases.

Note that the description continues on the assumption that parameters presented in FIG. 8 are used as such parameters as the area mesh division number and the length (number of bits) of absolute coordinate data in this embodiment. Specifically, for example, absolute latitude coordinate data has 24 bits, and absolute longitude coordinate data has 25 bits. Moreover, each of relative latitude coordinate data and relative longitude coordinate data has a fixed number of bits determined beforehand, i.e., 19 bits.

Meanwhile, at the time of use of an application, the longitude area mesh division number at each degree of latitude may be determined by actually performing the division number determination process. Alternatively, the longitude area mesh division number for each degree of latitude may easily be obtained by preparing beforehand an area mesh definition table presented in FIG. 9. This is achievable because the longitude area mesh division number M at each degree of latitude can be uniquely determined by specifying the longitude area mesh division number MI near the equator and the threshold TH in advance.

In the example depicted in FIG. 9, the column "LATITUDE AREA MESH NUMBER" contains real number values of the latitude area mesh number. The area mesh division number in the latitude direction here is 32. Accordingly, such information as the longitude area mesh division number is associated with the latitude area mesh number for each of 32 area meshes having the latitude area mesh numbers from 0 to 31.

The column "LATITUDE AREA MESH ORIGIN COORDINATE (DEG)" indicates latitude of the area mesh origin described in the DEG format. The column "LATITUDE AREA MESH ORIGIN COORDINATE (BA)" indicates coordinate values of latitude of the area mesh origin described in the BA format, i.e., binary values of the latitude area mesh number. The latitude area mesh division number in this example is 32. Accordingly, the latitude area mesh number includes 5-bit information.

The column "NUMBER OF BITS OF LONGITUDE AREA MESH NUMBER" indicates numbers of bits of the longitude area mesh numbers for the area meshes corresponding to the latitude area mesh numbers presented in the column "LATITUDE AREA MESH ORIGIN COORDINATE (BA)".

The column "LONGITUDE AREA MESH DIVISION NUMBER" indicates longitude area mesh division numbers at degrees of latitude indicated in the column "LONGITUDE AREA MESH ORIGIN COORDINATE (DEG)". Note that the longitude area mesh division number is difficult to be defined at ±90.0 degrees of latitude in this example. Accordingly, N/A (Not Available) is given to both the columns of "NUMBER OF BITS OF LONGITUDE AREA MESH NUMBER" AND "LONGITUDE AREA MESH DIVISION NUMBER" to indicate that the corresponding region is a region where position information is unavailable.

The area mesh definition table presented in FIG. 9 can be created by performing the division number determination process described with reference to FIG. 7. When such an area mesh definition table is obtained and retained beforehand, a longitude area mesh division number corresponding to each of latitude area mesh numbers can be obtained only by referring to the area mesh definition table.

<Configuration Example of Transmission Device>

A specific embodiment in a case of use of BA-format position information described above for wireless communication will next be touched upon.

Particularly described here will be an example of a case where a transmission device (transmitter) transmits position information indicating the own position of the transmission device to a reception device (receiver) via wireless communication such as LPWA communication. Such an example is applicable to such cases as delivery tracking of a load for delivery with use of a transmission device attached to the load and identification of a current spot of a person on the reception device side with use of a transmission device attached to the person.

For example, suppose that a reception device is capable of recognizing its own position and that a maximum communication distance at which a transmitted signal is receivable (hereinafter also referred to as a receivable maximum distance r) is limited.

In such a case, the reception device is capable of obtaining absolute coordinate data indicating an absolute position of the transmission device on the ground surface corresponding to the target region if only position information indicating a relative position of the transmission device within an area mesh, i.e., relative coordinate data, can be received. Specifically, the reception device is capable of deriving (restoring) absolute coordinate data indicating the position of the transmission device, on the basis of absolute coordinate data indicating the own position of the reception device and the relative coordinate data indicating the position of the transmission device.

Accordingly, not position information indicating the absolute position within the target region, but position information indicating a relative position within an area mesh, i.e., transmission data including relative latitude coordinate data and relative longitude coordinate data, is transmitted from the transmission device to the reception device.

Figure 10:
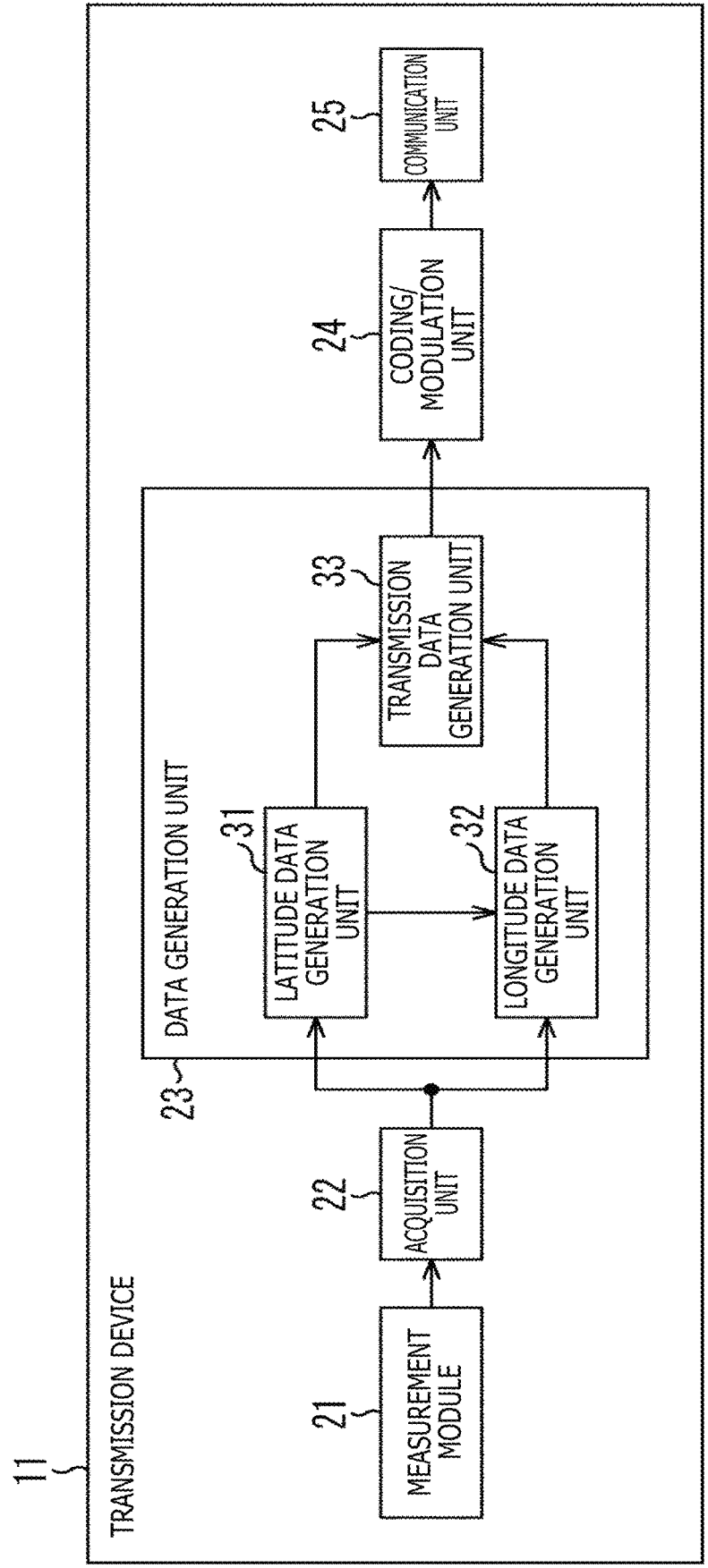
FIG. 10 is a diagram depicting a configuration example of a transmission device.

In a case of transmission of the transmission data described above to the reception device, the transmission device is configured as depicted in FIG. 10, for example.

A transmission device 11 depicted in FIG. 10 has a measurement module 21, an acquisition unit 22, a data generation unit 23, a coding/modulation unit 24, and a communication unit 25.

The measurement module 21 including a GNSS module, for example, measures a position of the transmission device 11, and supplies a measurement result thus obtained to the acquisition unit 22. The measurement module 21 obtains position information including DEG-format latitude and longitude of the transmission device 11 on the ground surface of the globe corresponding to a target region, as the measurement result of the position of the transmission device 11.

The acquisition unit 22 acquires DEG-format position information from the measurement module 21, and supplies the DEG-format position information to the data generation unit 23.

The data generation unit 23 generates BA-format position information, i.e., absolute coordinate data including an area mesh number and relative coordinate data, on the basis of the DEG-format position information supplied from the acquisition unit 22.

The data generation unit 23 has a latitude data generation unit 31, a longitude data generation unit 32, and a transmission data generation unit 33.

The latitude data generation unit 31 generates absolute latitude coordinate data indicating an absolute position of the transmission device 11, on the basis of the DEG-format position information supplied from the acquisition unit 22, and also extracts relative latitude coordinate data from the absolute latitude coordinate data to supply the extracted relative latitude coordinate data to the transmission data generation unit 33. Moreover, the latitude data generation unit 31 extracts a latitude area mesh number from the absolute latitude coordinate data, and supplies the extracted latitude area mesh number to the longitude data generation unit 32.

The longitude data generation unit 32 generates absolute longitude coordinate data indicating an absolute position of the transmission device 11, on the basis of the DEG-format position information supplied from the acquisition unit 22, and also extracts relative longitude coordinate data from the absolute longitude coordinate data to transmit the extracted relative longitude coordinate data to the transmission data generation unit 33.

For example, the longitude data generation unit 32 retains an area mesh definition table beforehand. The longitude data generation unit 32 specifies the number of bits of a longitude area mesh number corresponding to the latitude area mesh number supplied from the latitude data generation unit 31, by referring to the area mesh definition table, and extracts relative longitude coordinate data from absolute longitude coordinate data on the basis of the specified number of bits.

The transmission data generation unit 33 generates transmission data on the basis of the relative latitude coordinate data supplied from the latitude data generation unit 31 and the relative longitude coordinate data supplied from the longitude data generation unit 32, and supplies the transmission data to the coding/modulation unit 24. The transmission data contains at least the relative latitude coordinate data and the relative longitude coordinate data.

The coding/modulation unit 24 codes and modulates the transmission data supplied from the transmission data generation unit 33, supplies the coded and modulated transmission data to the communication unit 25, and causes the communication unit 25 to transmit the transmission data. For example, the communication unit 25 includes an antenna or the like and transmits the transmission data supplied from the coding/modulation unit 24, via LPWA communication or the like.

<Description of Transmission Process>

An operation of the transmission device 11 will next be described. Specifically, a transmission process performed by the transmission device 11 will be described below with reference to a flowchart presented in FIG. 11. Note that this transmission process is started at such timing as issue of a transmission data transmission request from the reception device and an elapse of a predetermined period of time from final transmission of transmission data.

In step S41, the acquisition unit 22 acquires DEG-format position information indicating a position of the transmission device 11 from the measurement module 21, and supplies the acquired position information to the latitude data generation unit 31 and the longitude data generation unit 32.

In step S42, the latitude data generation unit 31 generates absolute latitude coordinate data on the basis of the DEG-format position information supplied from the acquisition unit 22.

Specifically, the latitude data generation unit 31 substitutes latitude constituting the DEG-format position information for deg in Equation (1) described above, and calculates the conversion formula presented as Equation (1) to convert the DEG-format position information into BA-format absolute latitude coordinate data.

The absolute latitude coordinate data here is 24-bit data, and the latitude area mesh division number is 32. Accordingly, absolute latitude coordinate data depicted in FIG. 12 is obtained by processing in step S42.

Figure 12:
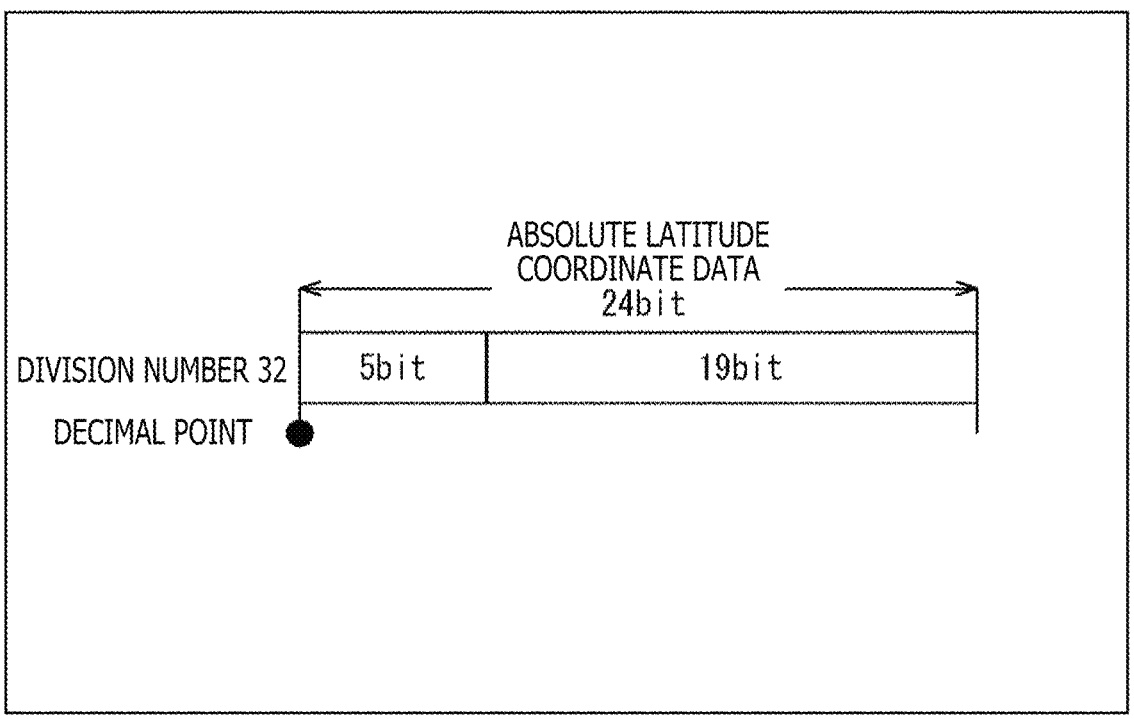
FIG. 12 is a diagram explaining absolute latitude coordinate data.

According to the example presented in FIG. 12, the absolute latitude coordinate data is 24-bit data, and a high-order 5-bit part of the absolute latitude coordinate data corresponds to a latitude area mesh number. In addition, a low-order 19-bit part of the absolute latitude coordinate data corresponds to relative latitude coordinate data.

Figure 11:
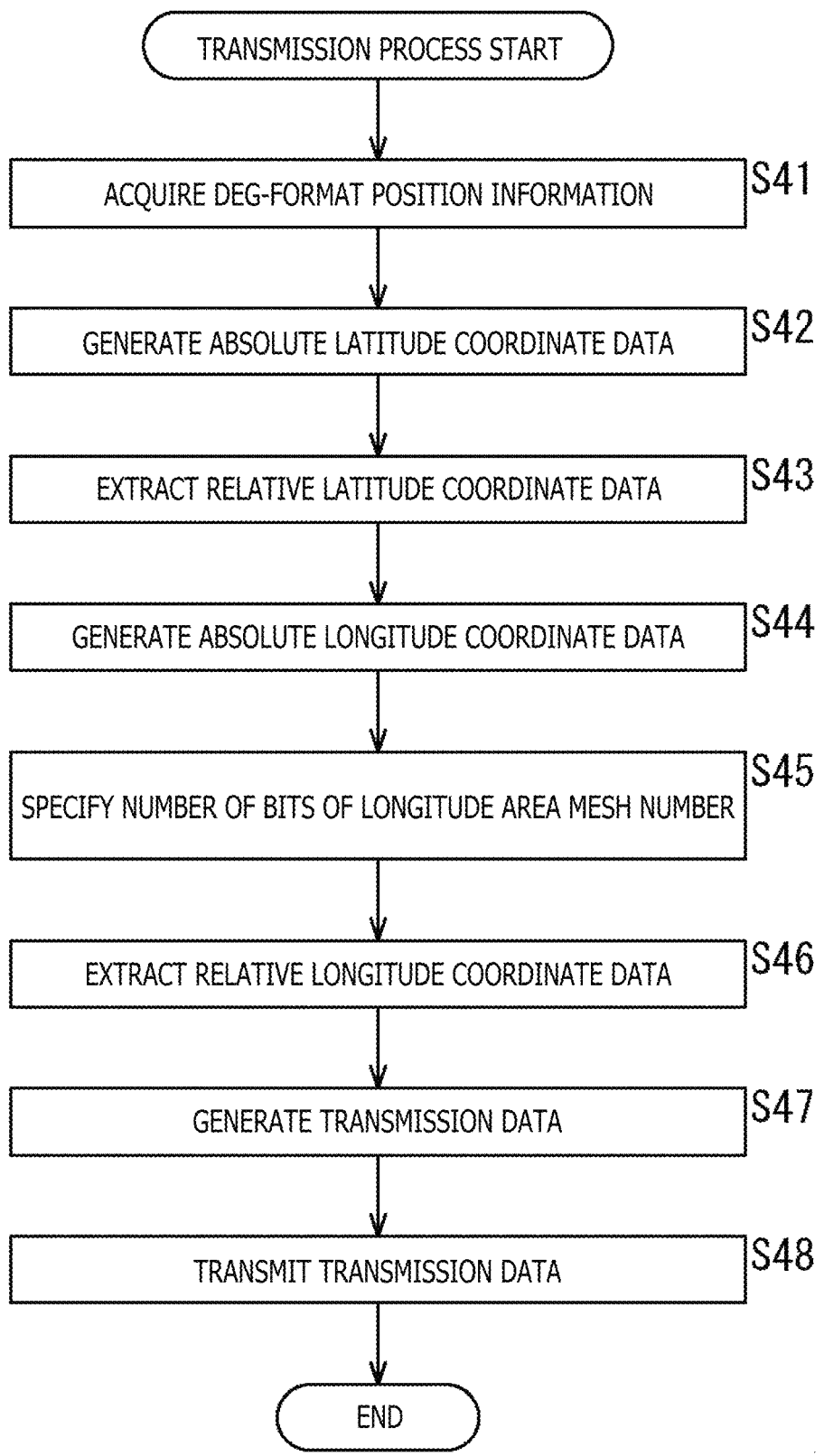
FIG. 11 is a flowchart explaining a transmission process.

Returning to the description with reference to the flowchart in FIG. 11, the latitude data generation unit 31 in step S43 extracts the relative latitude coordinate data from the absolute latitude coordinate data obtained by processing in step S42, and supplies the extracted relative latitude coordinate data to the transmission data generation unit 33. For example, according to the example depicted in FIG. 12, low-order 19 bits of the 24-bit absolute latitude coordinate data are extracted as relative latitude coordinate data.

Moreover, the latitude data generation unit 31 extracts a latitude area mesh number from the absolute latitude coordinate data, and supplies the extracted latitude area mesh number to the longitude data generation unit 32. For example, according to the example presented in FIG. 12, high-order 5 bits of the 24-bit absolute latitude coordinate data are extracted as a latitude area mesh number.

In step S44, the longitude data generation unit 32 generates absolute longitude coordinate data on the basis of the DEG-format position information supplied from the acquisition unit 22.

Specifically, the longitude data generation unit 32 substitutes longitude constituting the DEG-format position information for deg in Equation (2) described above, and calculates the conversion formula presented as Equation (2) to convert the DEG-format position information into BA-format absolute longitude coordinate data. Temporarily obtained here is 25-bit absolute longitude coordinate data.

In step S45, the longitude data generation unit 32 specifies the number of bits of the longitude area mesh number with reference to the area mesh definition table retained beforehand, on the basis of the latitude area mesh number supplied from the latitude data generation unit 31.

For example, 25-bit absolute longitude coordinate data is obtained by processing in step S44. However, according to the transmission device 11, the number of bits of the absolute longitude coordinate data varies according to the degree of latitude where the transmission device 11 is present, i.e., the latitude area mesh number. In other words, the number of bits of the longitude area mesh number and the longitude area mesh division number vary according to the latitude area mesh number.

Figure 13:
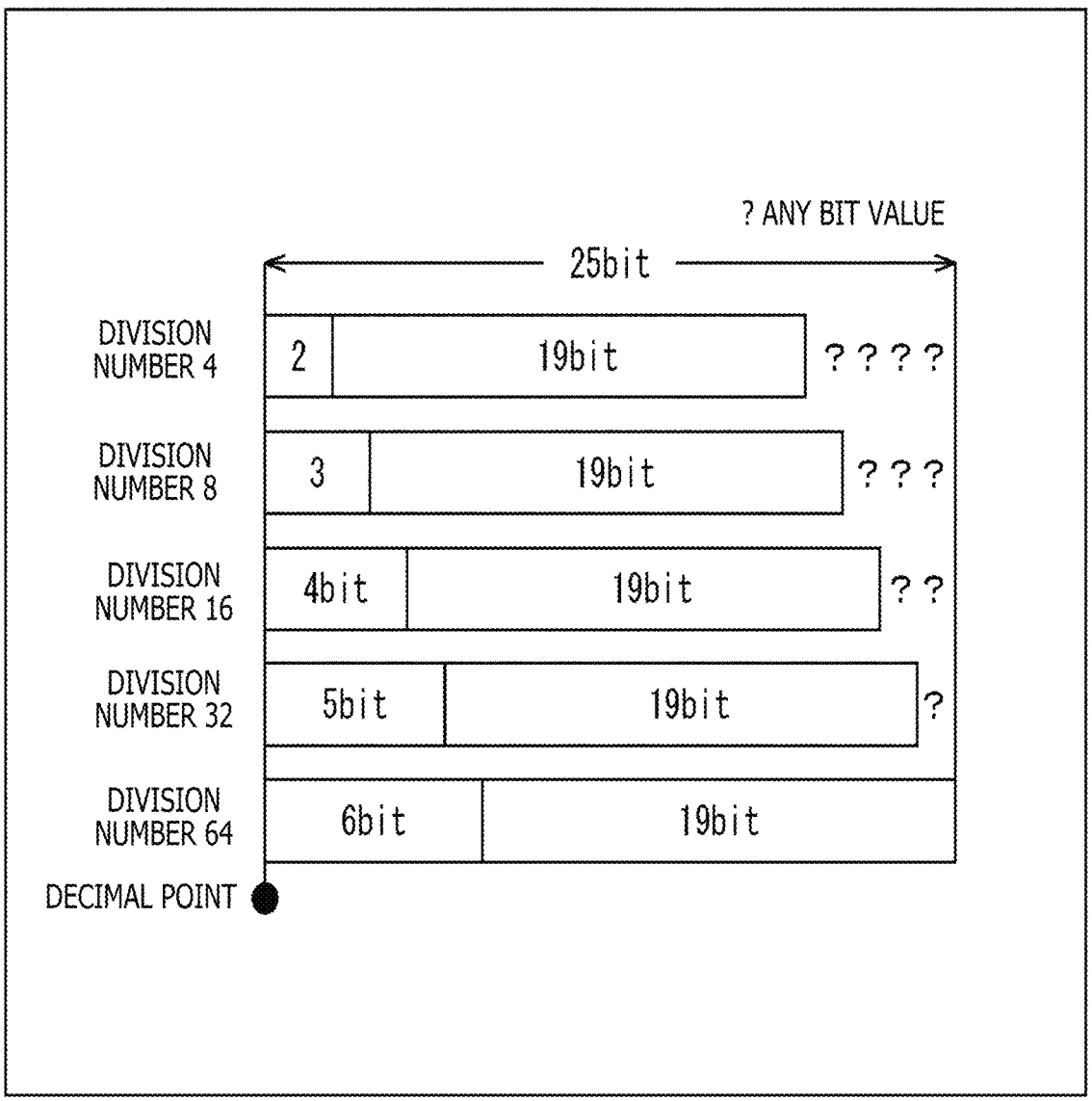
FIG. 13 is a diagram explaining absolute longitude coordinate data.

Accordingly, for example, as presented in FIG. 13, data having the number of bits included in the 25-bit absolute longitude coordinate data obtained in step S44 and specified by the latitude area mesh number is designated as the final absolute longitude coordinate data.

According to the example depicted in FIG. 13, the longitude area mesh number has 2 bits when the longitude area mesh division number determined for the latitude area mesh division number is 4, for example.

Accordingly, a high-order 2-bit part in the 25-bit absolute longitude coordinate data obtained in step S44 corresponds to the longitude area mesh number, and a 19-bit part following the longitude area mesh number corresponds to relative longitude coordinate data. Specifically, 21-bit data including the 2-bit longitude area mesh number and 19-bit relative longitude coordinate data added after the longitude area mesh number corresponds to the final absolute longitude coordinate data.

Similarly, when the longitude area mesh division number determined for the longitude area mesh division number is 16, for example, a high-order 4-bit part corresponds to a longitude area mesh number. In this case, a 19-bit part following the longitude area mesh number corresponds to the relative longitude coordinate data.

As apparent from above, according to the absolute longitude coordinate data generated by the longitude data generation unit 32, the number of bits of the longitude area mesh number varies according to the latitude area mesh number. However, the relative longitude coordinate data always has 19 bits. Accordingly, the number of bits of the entire absolute longitude coordinate data varies according to the latitude area mesh number.

When the number of bits of the entire absolute longitude coordinate data varies according to the latitude area mesh number, the interval (length) of the ground surface per minimum unit (LSB), i.e., per one bit, varies. Accordingly, accuracy of longitude indicated by the absolute longitude coordinate data varies. However, longitude (position) indicated by the absolute longitude coordinate data does not vary even when the number of bits of the entire absolute longitude coordinate data varies. Accordingly, appropriate reduction of the number of bits of the entire absolute longitude coordinate data is achievable while necessary accuracy is secured.

In the area mesh definition table, the number of bits of the longitude area mesh number and the longitude area mesh division number are recorded in association with each other for each of the latitude area mesh numbers. Accordingly, the longitude data generation unit 32 is capable of specifying the number of bits of the longitude area mesh number associated with the supplied latitude area mesh number by referring to the area mesh definition table.

For example, in the example presented in FIG. 9, the number of bits of the longitude area mesh number is 5 in a case where the latitude area mesh number is 12.

Accordingly, in this case, a high-order 5-bit part in the 25-bit absolute longitude coordinate data obtained in step S44 corresponds to the longitude area mesh number, and a 19-bit part following the longitude area mesh number corresponds to the relative longitude coordinate data.

Returning to the description with reference to the flowchart in FIG. 11, after the number of bits of the longitude area mesh number is specified in step S45, the process proceeds to step S46.

In step S46, the longitude data generation unit 32 extracts relative longitude coordinate data from the absolute longitude coordinate data obtained by processing in step S44, on the basis of a result of specification of the number of bits of the longitude area mesh number in step S45, and supplies the extracted relative longitude coordinate data to the transmission data generation unit 33.

A generation (extraction) example of the relative coordinate data will be described here with reference to FIG. 14.

In FIG. 14, both DEG-format position information and BA-format position information are presented for each of cities "Helsinki", "London", "Tokyo", "Singapore", and "Sydney".

Particularly, information associated with the latitude direction is presented in a part indicated by an arrow Q61, while information associated with the longitude direction is presented in a part indicated by an arrow Q62.

Specifically, in the part indicated by the arrow Q61, DEG-format latitude, a real number value of BA-format absolute latitude coordinate data, and a binary value of BA-format absolute latitude coordinate data are contained in the columns of "DEG FORMAT", "BA FORMAT (REAL NUMBER)", and "BA FORMAT (BIT)", respectively.

Moreover, in the part indicated by the arrow Q61, the number of bits of a latitude area mesh number, a latitude area mesh number, and a binary value of relative latitude coordinate data are contained in the columns of "NUMBER OF BITS OF AREA MESH NUMBER", "AREA MESH NUMBER", and "RELATIVE LATITUDE COORDINATE DATA", respectively.

On the other hand, in the part indicated by the arrow Q62, DEG-format longitude, a real number value of BA-format absolute longitude coordinate data, and a binary value of BA-format absolute longitude coordinate data are contained in the columns of "DEG FORMAT", "BA FORMAT (REAL NUMBER)", and "BA FORMAT (BIT)", respectively.

Moreover, in the part indicated by the arrow Q62, the number of bits of a longitude area mesh number, a longitude area mesh number, and a binary value of relative longitude coordinate data are contained in the columns of "NUMBER OF BITS OF AREA MESH NUMBER", "AREA MESH NUMBER", and "RELATIVE LONGITUDE COORDINATE DATA", respectively.

Focusing on the city "Helsinki" in FIG. 14, for example, DEG-format latitude is "60.171854". Equation (1) is calculated for this degree of latitude, and a binary value of BA-format absolute latitude coordinate data "11010101100100111100111" is obtained.

In addition, the number of bits of the latitude area mesh number is 5. Accordingly, low-order 19 bits of the binary value of the BA-format absolute latitude coordinate data "11010101100100111100111" are extracted, and designated as a binary value of relative latitude coordinate data "1011001001111100111".

In addition, high-order 5 bits of the binary value of the BA-format absolute latitude coordinate data "11010101100100111100111" are extracted, and designated as a binary value of a latitude area mesh number "11010".

On the other hand, as for the longitude direction, the DEG-format longitude of "Helsinki" is "24.941447". Equation (2) is calculated for this degree of longitude, and a binary value of the BA-format absolute longitude coordinate data "100100011011110001100111" is obtained.

Moreover, the latitude area mesh number of "Helsinki" has a binary value "11010" and has a real value of 26. Accordingly, it is apparent that the number of bits of the longitude area mesh number corresponding to the latitude area mesh number "26" is 4 with reference to the area mesh definition table presented in FIG. 9. Specifically, as indicated by an arrow Q63 in FIG. 14, the number of bits of the longitude area mesh number "4" is specified on the basis of the latitude area mesh number "26" with reference to the area mesh definition table.

Accordingly, 19-bit data after the longitude area mesh number is extracted from the binary value of the BA-format absolute longitude coordinate data of "Helsinki" "100100011011110001100111" on the basis of the specified number of bits of the longitude area mesh number "4", and is designated as a binary value of the relative longitude coordinate data "0001101111000111001". In other words, data from 5th bit to 23rd bit of the absolute longitude coordinate data is extracted and designated as the relative longitude coordinate data.

While the area mesh definition table is used in the example described here, the longitude data generation unit 32 may specify the number of bits of the longitude area mesh number by performing a process similar to the division number determination process described with reference to FIG. 7, on the basis of the latitude area mesh number.

Returning to the description in FIG. 11, the transmission data generation unit 33 in step S47 generates transmission data on the basis of the relative latitude coordinate data supplied from the latitude data generation unit 31 and the relative longitude coordinate data supplied from the longitude data generation unit 32, and supplies the transmission data to the coding/modulation unit 24.

The coding/modulation unit 24 codes and modulates the transmission data supplied from the transmission data generation unit 33, and supplies the transmission data thus obtained to the communication unit 25.

In step S48, the communication unit 25 transmits the transmission data supplied from the coding/modulation unit 24 to the reception device, and thereafter, the transmission process ends.

In the manner described above, the transmission device 11 generates absolute coordinate data corresponding to BA-format position information on the basis of DEG-format position information, and also generates transmission data on the basis of the absolute coordinate data to transmit the generated transmission data. At this time, concerning absolute longitude coordinate data included in the absolute coordinate data, reduction of the number of bits is achievable with ensured necessary accuracy by varying the number of bits (size) according to each degree of latitude. Moreover, further reduction of the number of bits of position information received through communication by the number of bits of the area mesh number is achievable by transmitting relative coordinate data as transmission data.

<Process on Reception Device Side>

Subsequently described will be a reception device which receives transmission data transmitted from the transmission device 11, and restores absolute coordinate data indicating a position of the transmission device 11, on the basis of the received transmission data and absolute coordinate data indicating the own position of the reception device.

The receivable maximum distance r described above is determined for the reception device. The receivable maximum distance r is a maximum distance to a transmission source of the transmission data from the reception device receiving the transmission data. In other words, the receivable maximum distance r represents a maximum distance from the transmission device 11 to the reception device.

The receivable maximum distance r defined as above is determined by transmission power achieved by the transmission device 11 for transmitting transmission data, i.e., communication performance of the transmission device 11, and communication performance of the reception device.

For example, considering that the globe as the target region is an ellipsoid body, a reaching distance of radio waves on the ground is a little longer than 300 km at most under an unobstructed view condition. Accordingly, the receivable maximum distance r always becomes 300 km or shorter. Moreover, the threshold TH described above may be determined on the basis of the receivable maximum distance r.

Figure 15:
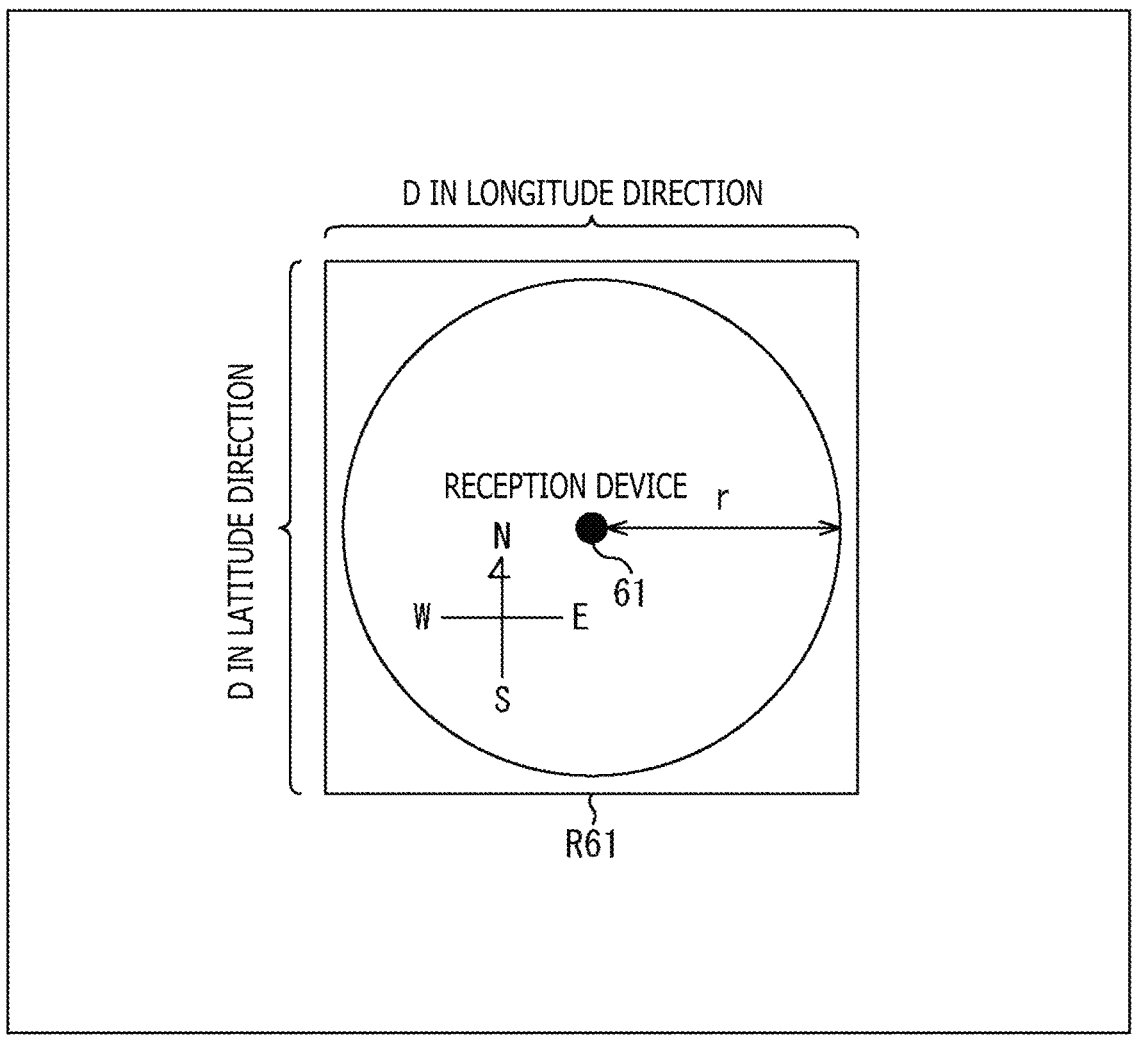
FIG. 15 is a diagram explaining a receivable maximum distance.

The reception device is configured such that a circle which has a center located at the reception device 61 and has a radius equal to the receivable maximum distance r becomes smaller than the area mesh as depicted in FIG. 15 so as to correctly restore absolute coordinate data indicating the position of the transmission device 11 from the transmission data.

Specifically, the distance from the reception device 61 to the transmission device 11 is made shorter than half the length of an area mesh containing the reception device 61 in the latitude direction or the longitude direction.

In FIG. 15, a region R61 having a square shape represents one area mesh, and a circle having a radius equal to the receivable maximum distance r is made smaller than a region of this area mesh.

In other words, assuming that the length of one side of the area mesh containing the reception device 61 is D, D>2r always holds. Specifically, a virtual image of the transmission device 11 is actually generated in another area mesh positioned adjacent to the area mesh containing the transmission device 11 as will be described later. Accordingly, the above relation is made to hold to allow distinction between the virtual image and the actual transmission device 11.

The relation D>2r is usually made to hold, and thus, the description continues below on the assumption that D>2r holds. However, in a case where D>2r does not hold, it is sufficient if a receivable maximum distance r' achieving D>2r' is set for the reception device 61 to prohibit reception of transmission data transmitted from the transmission device 11 located at a distance longer than the receivable maximum distance r'.

Restoration of absolute coordinate data indicating a position of the transmission device 11 will be described here with reference to FIG. 16.

Figure 16:
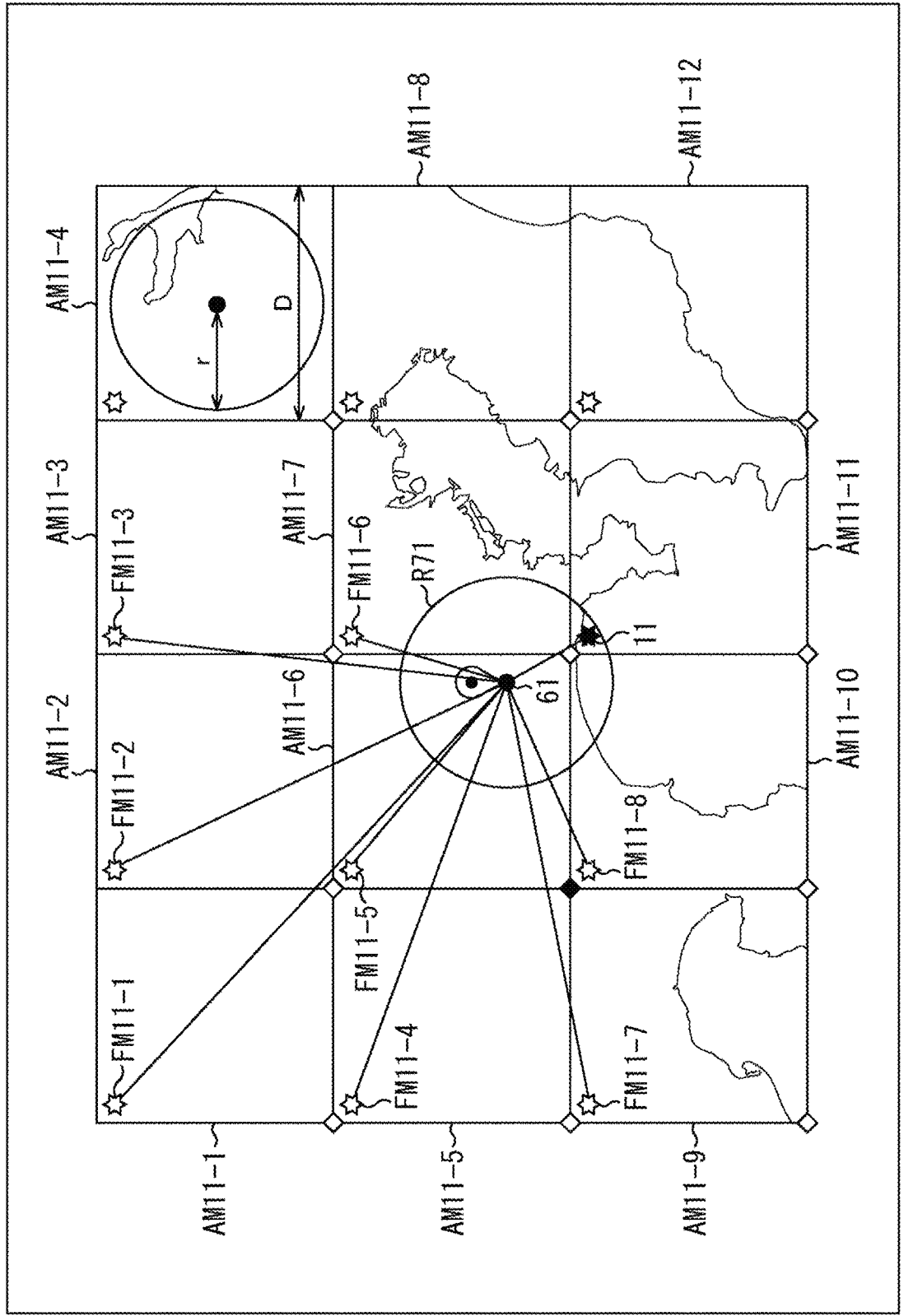
FIG. 16 is a diagram explaining restoration of absolute coordinate data.

FIG. 16 depicts a part of the ground surface corresponding to a target region. This ground surface part is divided into area meshes AM11-1 to AM11-12. A lower left peak of these area meshes in the figure corresponds to an area mesh origin.

Note that each of the area meshes AM11-1 to AM11-12 will also simply be referred to as an area mesh AM11 below in a case where no particular distinction between the area meshes AM11-1 to AM11-12 is needed. In addition, each of the area meshes AM11 is smaller than an actual area mesh in FIG. 16 for easy understanding of the description.

In this example, the transmission device 11 is located within the area mesh AM11-11, while the reception device 61 is located within the area mesh AM11-6. Moreover, a region R71 represents a circular region which has a center located at the reception device 61 and has a radius equal to the receivable maximum distance r.

The reception device 61 is unable to receive transmission data transmitted from a position at a distance longer than the receivable maximum distance r. Accordingly, the transmission device 11 is always located within the region R71.

When transmission data indicating the position of the transmission device 11 is transmitted from the transmission device 11, the reception device 61 receives the transmission data thus transmitted.

This transmission data is relative coordinate data indicating the position of the transmission device 11 within the area mesh AM11. Accordingly, the reception device 61 can specify the relative position of the transmission device 11 as viewed from the area mesh origin, but cannot specify an absolute position of the transmission device 11 on the basis of only the transmission data.

In other words, which of the actual position of the transmission device 11 and plural virtual images of the transmission device 11 generated at such positions as FM11-1 to FM11-8 is a true position of the transmission device 11 cannot be specified on the basis of only the transmission data.

Accordingly, the reception device 61 specifies the actual position of the transmission device 11 by using the position of the reception device 61 itself, on the basis of the state where D>2r holds. Specifically, absolute coordinate data indicating the position of the transmission device 11 is restored.

Specifically, the reception device 61 first adds (synthesizes) relative coordinate data contained in the transmission data to the area mesh origin coordinate, i.e., the area mesh number, of each of the area mesh AM11 containing the reception device 61 itself and the area meshes AM11 adjacent to the area mesh AM11 containing the reception device 61. Thereafter, the reception device 61 performs zero-padding for the end of data obtained by the synthesis, as necessary, and designates the absolute coordinate data thus obtained as the candidate data.

For example, suppose that candidate data is generated for each of targets of the area mesh AM11-6 containing the reception device 61 and the area meshes AM11 located on the upper, lower, left, and right sides of the area mesh AM11-6 in the figure.

In that case, 9 pieces of absolute coordinate data in total, i.e., absolute coordinate data indicating respective absolute positions of the positions FM11-1 to FM11-8 and absolute coordinate data indicating an actual absolute position of the transmission device 11, are obtained as the candidate data.

It is assumed that the reception device 61 calculates a distance from the reception device 61 to a position indicated by the candidate data, on the basis of the absolute coordinate data indicating the absolute position of the reception device 61 itself and the respective candidate data, and designates the candidate data corresponding to a calculated shortest distance in the plural pieces of candidate data, as candidate data indicating the position of the transmission device 11. Accordingly, in this example, candidate data indicating the actual position of the transmission device 11 is correctly selected as data indicating the position of the transmission device 11.

This data can be selected because candidate data indicating a position contained in the region R71 is always only one piece of data in the state where D>2r holds. In this case, the position indicated by this candidate data corresponds to the position at the shortest distance from the reception device 61 in all pieces of the candidate data.

Accordingly, between the transmission device 11 and the reception device 61, the reception device 61 is capable of correctly specifying the position of the transmission device 11 without the necessity of transmitting the area mesh number of the area mesh containing the transmission device 11 in a form contained in the transmission data.

In this case, it is sufficient if only the relative coordinate data is transmitted as the transmission data. Accordingly, the number of bits of data received between the transmission device 11 and the reception device 61 can be further reduced by the number of bits corresponding to the area mesh number.

Note that described here is an example where transmission data indicating the position of the transmission device 11 is directly received from the transmission device 11. However, a transmission source of the transmission data indicating the position of the transmission device 11 is not limited to the transmission device 11 and may be other devices.

<Configuration Example of Reception Device>

A configuration example of the reception device 61 will next be described.

Figure 17:
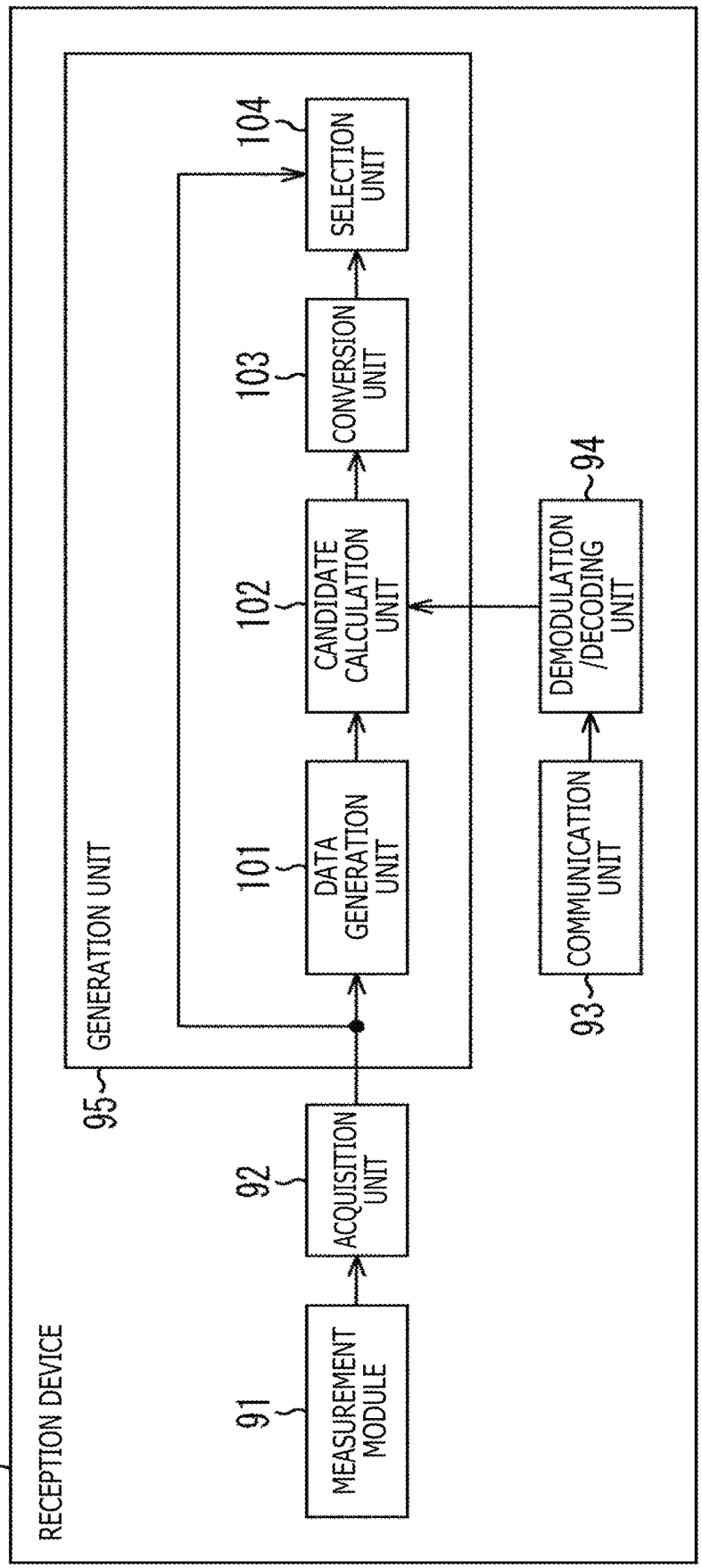
FIG. 17 is a diagram depicting a configuration example of a reception device.

For example, the reception device 61 is configured as depicted in FIG. 17.

The reception device 61 depicted in FIG. 17 includes a measurement module 91, an acquisition unit 92, a communication unit 93, a demodulation/decoding unit 94, and a generation unit 95.

The measurement module 91 including a GNSS module, for example, measures a position of the reception device 61, and supplies a measurement result thus obtained to the acquisition unit 92. As the measurement result of the position of the reception device 61, the measurement module 91 obtains position information including DEG-format latitude and longitude of the reception device 61 on the ground surface of the globe corresponding to a target region.

The acquisition unit 92 acquires DEG-format position information from the measurement module 91, and supplies the acquired position information to the generation unit 95.

The communication unit 93 including an antenna or the like, for example, receives transmission data transmitted from the transmission device 11 via wireless communication such as LPWA communication, and supplies the transmission data to the demodulation/decoding unit 94.

The demodulation/decoding unit 94 demodulates and decodes the transmission data supplied from the communication unit 93 to extract relative coordinate data from the transmission data, and supplies the extracted relative coordinate data to the generation unit 95.

The generation unit 95 generates position information indicating a position of the transmission device 11, on the basis of the DEG-format position information supplied from the acquisition unit 92 and the relative coordinate data supplied from the demodulation/decoding unit 94. The generation unit 95 has a data generation unit 101, a candidate calculation unit 102, a conversion unit 103, and a selection unit 104.

The data generation unit 101 generates absolute coordinate data as BA-format position information on the basis of the DEG-format position information supplied from the acquisition unit 92, and also calculates area mesh origin coordinates from the obtained absolute coordinate data to supply the area mesh origin coordinates to the candidate calculation unit 102. For example, the data generation unit 101 retains an area mesh definition table beforehand. The data generation unit 101 specifies the number of bits of a longitude area mesh number corresponding to a latitude area mesh number of generated absolute coordinate data, by referring to the area mesh definition table, and generates area mesh origin coordinates on the basis of the specified number of bits.

The candidate calculation unit 102 generates candidate data on the basis of the area mesh origin coordinate supplied from the data generation unit 101 and the relative coordinate data supplied from the demodulation/decoding unit 94, and supplies the generated candidate data to the conversion unit 103.

The candidate calculation unit 102 designates, as candidate area meshes, the area mesh containing the reception device 61 and the plural area meshes located near the area mesh containing the reception device 61, on the basis of the area mesh origin coordinate, and calculates area mesh origin coordinates of the respective candidate area meshes.

Thereafter, the received relative coordinate data is added to each end of the respective area mesh origin coordinates to obtain candidate data. In addition, more specifically, zero-padding is performed for the end of the relative coordinate data as necessary for each of the candidates. In addition, the area mesh origin coordinate of each of the candidate area meshes will hereinafter also be referred to as a candidate area mesh origin coordinate.

The conversion unit 103 supplies the BA-format candidate data supplied from the candidate calculation unit 102 into DEG-format position information, and supplies the DEG-format position information to the selection unit 104. The candidate data converted into the DEG format will hereinafter also be referred to as candidate position information.

The selection unit 104 selects candidate position information indicating the position of the transmission device 11 from plural pieces of the candidate position information, on the basis of the DEG-format position information supplied from the acquisition unit 92 and the candidate position information supplied from the conversion unit 103. Specifically, position information indicating the position of the transmission device 11 is determined by selecting one of the plural pieces of candidate position information.

<Description of Reception Process>

An operation of the reception device 61 will next be described. Specifically, a reception process performed by the reception device 61 will hereinafter be described with reference to a flowchart presented in FIG. 18. This reception process is started at such timing when transmission data is transmitted from the transmission device 11 located at a position within the receivable maximum distance r from the reception device 61 or when the reception device 61 requests the transmission device 11 to transmit transmission data, for example.

In step S71, the acquisition unit 92 acquires DEG-format position information indicating the position of the reception device 61 from the measurement module 91, and supplies the acquired position information to the data generation unit 101 and the selection unit 104.

In step S72, the data generation unit 101 generates BA-format absolute coordinate data on the basis of the DEG-format position information supplied from the acquisition unit 92.

Specifically, the data generation unit 101 substitutes latitude of the DEG-format position information for deg in Equation (1) described above, and calculates the conversion formula presented as Equation (1) to convert the DEG-format position information into BA-format absolute latitude coordinate data.

Similarly, the data generation unit 101 substitutes longitude constituting the DEG-format position information for deg in Equation (2) described above, and calculates the conversion formula presented as Equation (2) to convert the DEG-format position information into BA-format absolute longitude coordinate data.

In step S73, the data generation unit 101 specifies the number of bits of the longitude area mesh number of the generated absolute coordinate data on the basis of the absolute coordinate data obtained by processing in step S72 and the area mesh definition table retained beforehand.

In step S74, the data generation unit 101 obtains area mesh origin coordinates on the basis of the absolute coordinate data obtained in processing in step S72 and the number of bits of the longitude area mesh number specified in step S73.

For example, in step S72, BA-format position information (absolute coordinate data) including 24-bit absolute latitude coordinate data and 25-bit absolute longitude coordinate data is obtained by calculation using a conversion formula.

Figure 19:
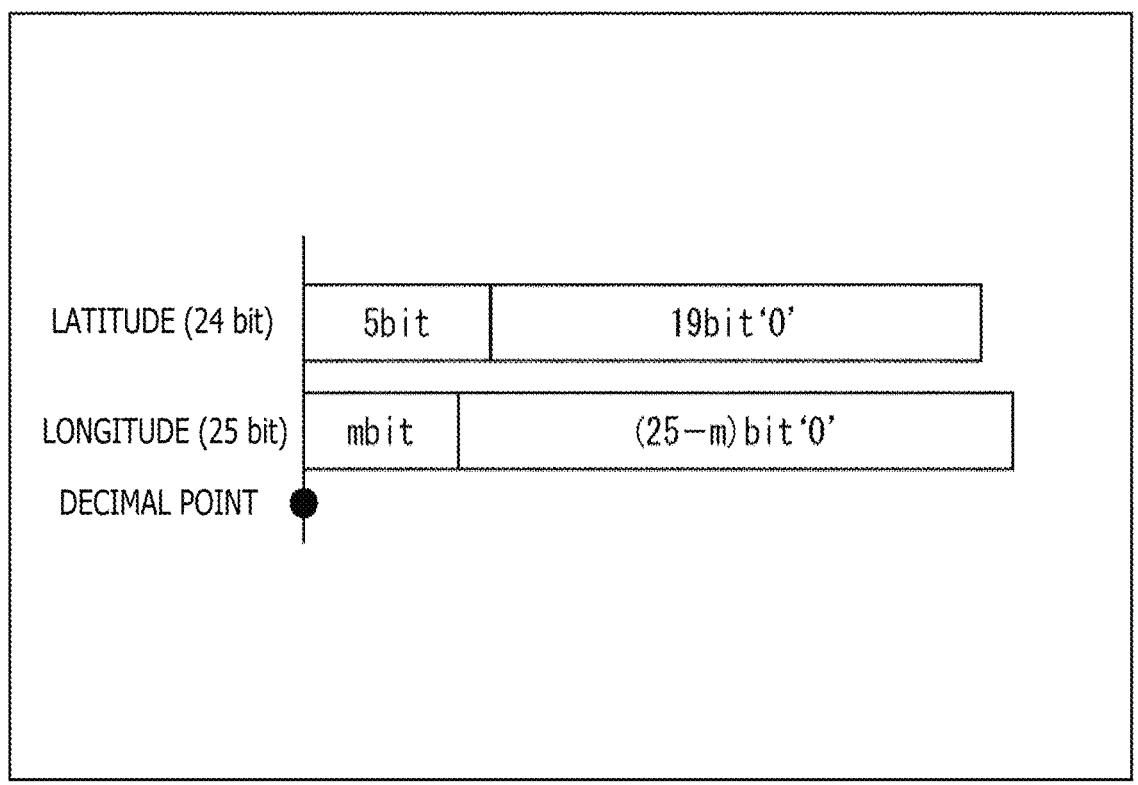
FIG. 19 is a diagram explaining absolute coordinate data.

The area mesh division number in the latitude direction here is 32. Accordingly, as presented in FIG. 19, high-order 5 bits of the 24-bit absolute latitude coordinate data correspond to a latitude area mesh number indicating a latitude coordinate value of the area mesh origin coordinate. In addition, more specifically, 19-bit zero data is added after high-order 5 bits of the absolute latitude coordinate data to constitute the latitude coordinate value of the 24-bit area mesh origin coordinate.

On the other hand, the area mesh division number in the longitude direction varies according to each degree of latitude, i.e., the latitude area mesh number. Accordingly, in step S73, the number of bits of a longitude area mesh number is specified with reference to the area mesh definition table.

Assuming that the specified number of bits is m, it is specified that high-order m bits of the 25-bit absolute longitude coordinate data correspond to the longitude area mesh number indicating a longitude coordinate value of the area mesh origin coordinate. In addition, more specifically, (25-m)-bit zero data is added after the high-order m bits of the absolute longitude coordinate data to constitute the longitude coordinate value of the 25-bit area mesh origin coordinates as presented in a lower part of FIG. 19.

For example, assuming that the data generation unit 101 retains the area mesh definition table presented in FIG. 9 and that the latitude area mesh number is 11, it is specified that the number of bits of the longitude area mesh number is 5.

In this case, it is apparent that the high-order m=5 bits of the absolute longitude coordinate data correspond to the longitude area mesh number. Accordingly, in step S74, high-order 5 bits of the absolute latitude coordinate data are extracted as the latitude area mesh number, and high-order 5 bits of the absolute longitude coordinate data are extracted as the longitude area mesh number, to generate the area mesh origin coordinates.

Figure 18:
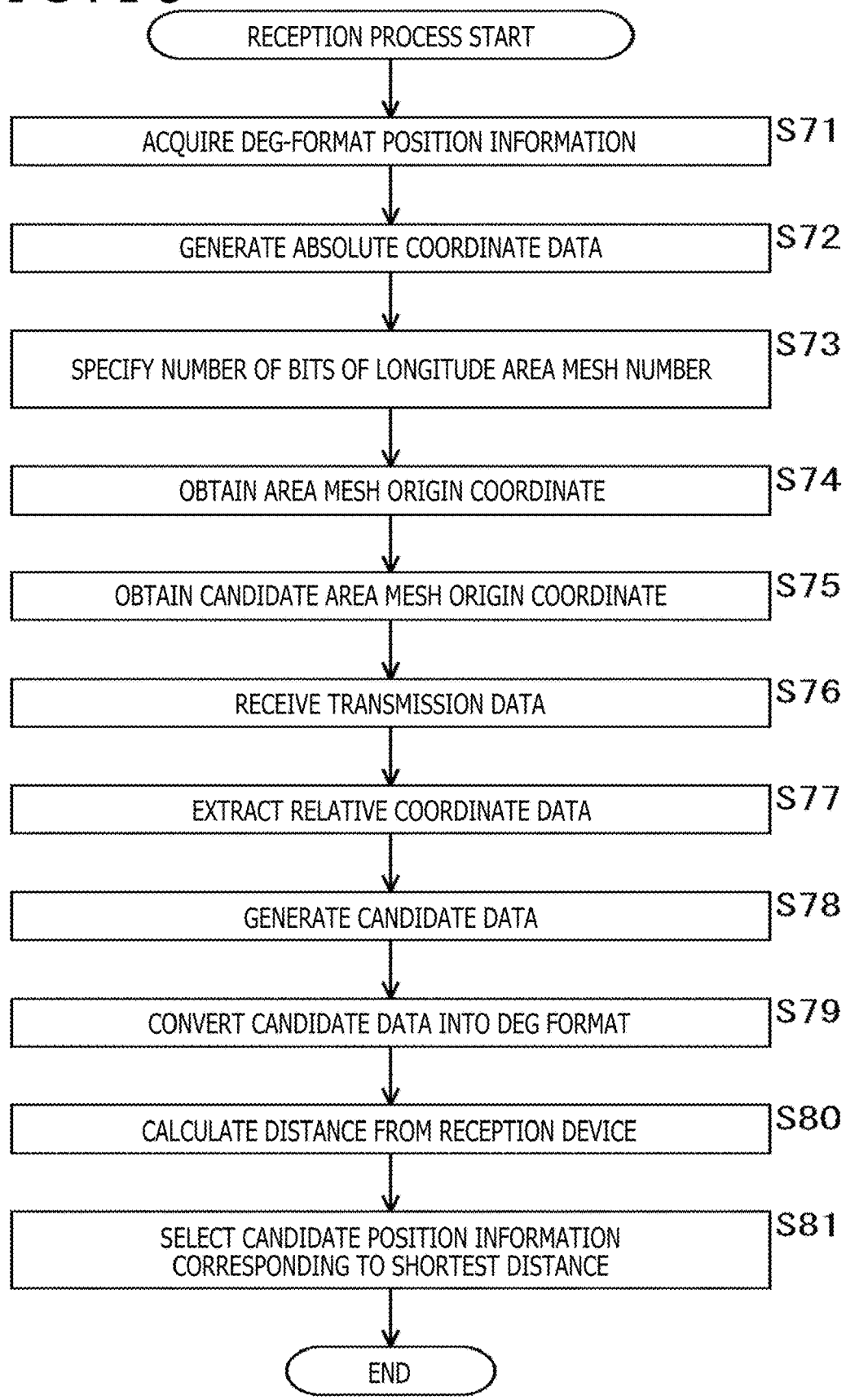
FIG. 18 is a flowchart explaining a reception process.

Returning to the description with reference to FIG. 18, after the area mesh origin coordinates are obtained, the data generation unit 101 supplies the obtained area mesh origin coordinates to the candidate calculation unit 102. Thereafter, the process proceeds to step S75.

In step S75, the candidate calculation unit 102 obtains candidate area mesh origin coordinates on the basis of the area mesh origin coordinates supplied from the data generation unit 101.

In step S75, the area mesh containing the reception device 61 and the plural area meshes located adjacent to the area mesh containing the reception device 61 are designated as candidate area meshes, and area mesh origin coordinates of the plural candidate area meshes are calculated as candidate area mesh origin coordinates.

In step S76, the communication unit 93 receives the transmission data transmitted from the transmission device 11, and supplies the transmission data to the demodulation/decoding unit 94.

In step S77, the demodulation/decoding unit 94 extracts relative coordinate data from the transmission data supplied from the communication unit 93.

The demodulation/decoding unit 94 demodulates and decodes the transmission data, extracts 19-bit relative latitude coordinate data and 19-bit relative longitude coordinate data from the demodulated and decoded transmission data, and supplies the extracted data to the candidate calculation unit 102.

In step S78, the candidate calculation unit 102 generates candidate data on the basis of the respective candidate area mesh origin coordinates obtained in step S75 and the relative coordinate data obtained in step S77, and supplies the generated candidate data to the conversion unit 103.

For example, suppose that candidate area mesh origin coordinates including a 5-bit latitude area mesh number and an m-bit longitude area mesh number are obtained for one candidate area mesh.

Figure 20:
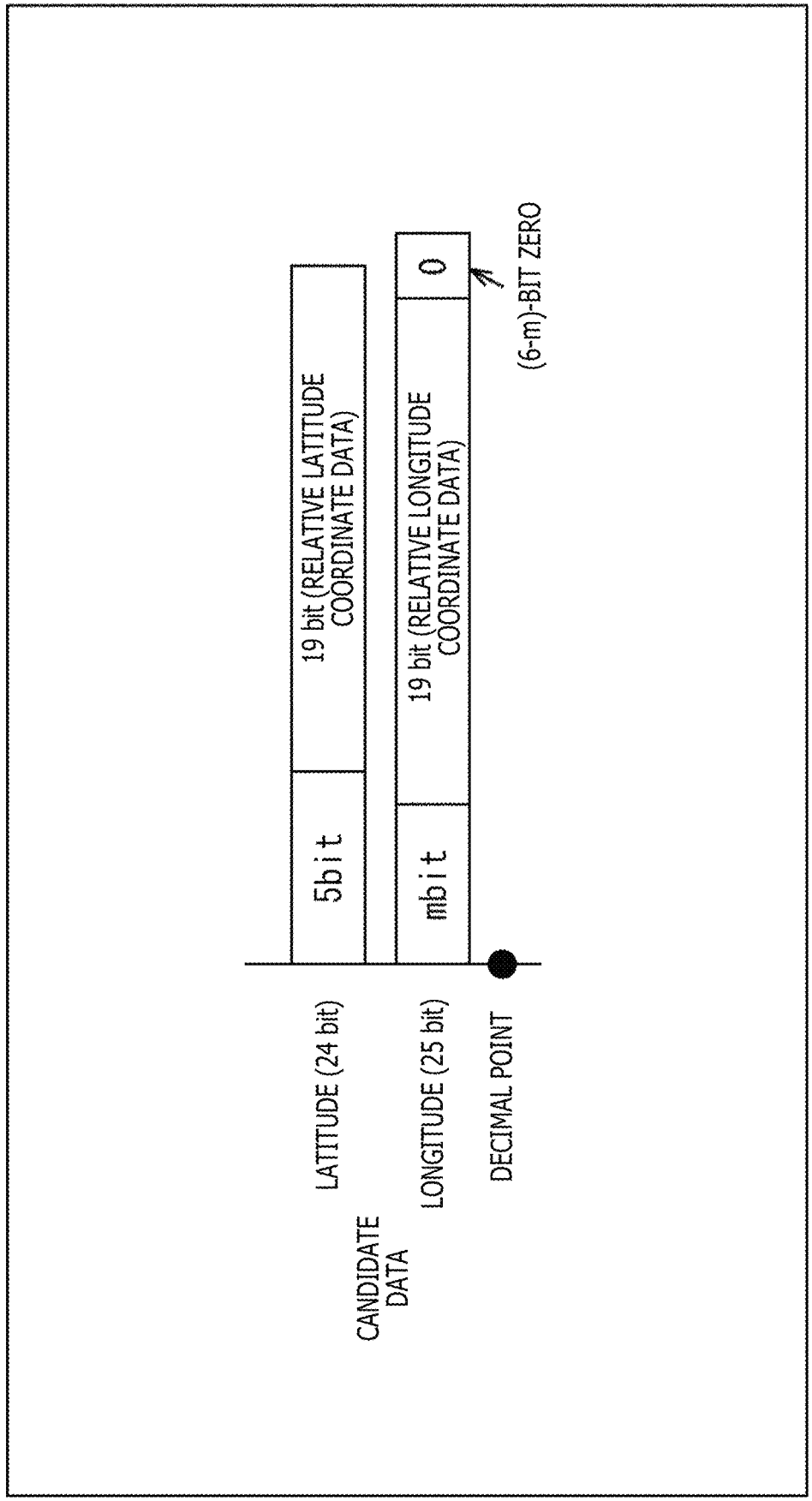
FIG. 20 is a diagram explaining candidate data.

In that case, the candidate calculation unit 102 synthesizes (adds) the 19-bit relative latitude coordinate data extracted in step S77 to the end of the 5-bit latitude area mesh number as presented in FIG. 20, for example, and designates the synthesized data as 24-bit absolute latitude coordinate data constituting candidate data.

On the other hand, the candidate calculation unit 102 synthesizes (adds) the 19-bit relative longitude coordinate data extracted in step S77 to the end of the m-bit longitude area mesh number. Moreover, the candidate calculation unit 102 performs zero-padding for adding (6-m)-bit zero-data to the end of the relative longitude coordinate data synthesized to the longitude area mesh number, and designates 25-bit data thus obtained as absolute longitude coordinate data constituting candidate data. In other words, absolute coordinate data is obtained for each of latitude and longitude by adding the candidate area mesh origin coordinates to the zero-padded relative coordinate data.

The candidate data obtained in the manner described above is BA-format position information (coordinate information) indicating the absolute position of the transmission device 11 located on the ground surface corresponding to a target region in a case where the transmission device 11 is contained in the candidate area mesh.

Returning to the description in FIG. 18, in step S79, the conversion unit 103 converts the plural pieces of candidate data supplied from the candidate calculation unit 102 into candidate position information which is DEG-format position information.

For example, the conversion unit 103 substitutes the absolute latitude coordinate data constituting the candidate data for ba in Equation (3) described above, and calculates the conversion formula presented in Equation (3) to convert the BA-format absolute latitude coordinate data into DEG-format latitude.

Similarly, the conversion unit 103 substitutes the absolute longitude coordinate data constituting the candidate data for ba in Equation (4) described above, and calculates the conversion formula presented in Equation (4) to convert the BA-format absolute longitude coordinate data into DEG-format longitude.

In this manner, DEG-format position information including latitude and longitude and indicating the absolute position of the transmission device 11 on the ground surface corresponding to the target region is obtained as candidate position information. The conversion unit 103 supplies plural pieces of the candidate position information thus obtained to the selection unit 104.

In step S80, the selection unit 104 calculates the distance from the reception device 61 to the position (transmission device 11) indicated by the candidate position information, on the basis of the candidate position information and the DEG-format position information indicating the position of the reception device 61 and supplied from the acquisition unit 92, for each piece of the candidate position information supplied from the conversion unit 103.

In step S81, the selection unit 104 selects candidate position information corresponding to a shortest distance obtained in step S80 in the plural pieces of candidate position information, as DEG-format position information indicating a correct position of the transmission device 11, and the reception process ends. In this manner, position information indicating the absolute position of the transmission device 11 within the target region is restored from the transmission data, i.e., the relative coordinate data.

In the manner described above, the reception device 61 obtains DEG-format position information indicating the absolute position of the transmission device 11, on the basis of the transmission data received from the transmission device 11 and the position information indicating the own position of the reception device 61. In this case, by using the BA-format position information having the number of bits varying according to each degree of latitude, as position information, reduction of the number of bits is achievable while necessary accuracy is secured. Moreover, by transmitting only the relative coordinate data as the transmission data, further reduction of the number of bits by the number of bits of the area mesh number is achievable.

<Selection of Candidate Area Mesh Origin Coordinates>

An example of the method for calculating the candidate area mesh origin coordinates (deriving method) performed in step S75 in FIG. 18 will be described here in more detail.

As described above, plural area meshes including the area mesh containing the reception device 61 and the area meshes located adjacent to the area mesh containing the reception device 61 are designated as candidate area meshes.

In other words, a set of the area mesh origin coordinates of the plural area meshes including the area mesh containing the reception device 61 and the area meshes located adjacent to the area mesh containing the reception device 61 are a set of candidate area mesh origin coordinates {(mLat, mLon)}.

Note that mLat represents a real number value of the latitude area mesh number constituting the candidate area mesh origin coordinates and that mLon represents a real number value of the longitude area mesh number constituting the candidate area mesh origin coordinates.

Hereinafter, in particular, a real number value of the latitude area mesh number of the candidate area mesh containing the reception device 61 will also be described as mLat_o, and a real number value of the longitude area mesh number of the candidate area mesh containing the reception device 61 will also be described as mLon_o.

The candidate calculation unit 102 selects the candidate area meshes and derives the candidate area mesh origin coordinates of the selected candidate area meshes in the following manner, on the basis of the latitude area mesh number mLat_o and the longitude area mesh number mLon_o.

Specifically, assuming that a predetermined variable is i (where, i=−1, 0, 1), the candidate calculation unit 102 designates each of the latitude area mesh numbers mLat={mLat_o+i} (where, i=−1, 0, 1) arranged in the latitude direction, as the latitude area mesh number mLat_of the candidate area mesh.

Moreover, the candidate calculation unit 102 compares the longitude area mesh division number M at the latitude area mesh number mLat_o with the longitude area mesh division number at the latitude area mesh number mLat for each of the latitude area mesh numbers mLat={mLat_o+i} (where, i=−1, 0, 1).

Note that the longitude area mesh division number may be specified with reference to the area mesh definition table retained in the candidate calculation unit 102 beforehand.

The candidate calculation unit 102 designates each of six longitude area mesh numbers mLon={2mLon_o+i} (where, i=−2, −1, 0, 1, 2, 3) represented by the following Equation (5), as the longitude area mesh number of the candidate area mesh, in a case where the longitude area mesh division number at the latitude area mesh number mLat is large in comparison with the longitude area mesh division number M at the latitude area mesh number mLat_o.

[Math. 5]

$$mLon=\{2\times mLon\_o+i\}, i=-2,-1,0,1,2,3 \quad (5)$$

Moreover, the candidate calculation unit 102 designates each of three longitude area mesh numbers mLon={mLon_o+i} (where, i=−1, 0, 1) represented by the following Equation (6) as the longitude area mesh number of the candidate area mesh in a case where the longitude area mesh division number at the latitude area mesh number mLat is equal to the longitude area mesh division number M at the latitude area mesh number mLat_o.

[Math. 6]

$$mLon=\{mLon\_o+i\}, i=-1,0,1 \quad (6)$$

Further, the candidate calculation unit 102 designates each of two longitude area mesh numbers mLon={floor((mLon_o−1)/2+i} (where, i=0, 1) represented by the following Equation (7), as the longitude area mesh number of the candidate area mesh, in a case where the longitude area mesh division number at the latitude area mesh number mLat is small in comparison with the longitude area mesh division number M at the latitude area mesh number mLat_o. Note that floor(A) in Equation (7) is a floor function which outputs a maximum integer not exceeding an argument A.

[Math. 7]

$$mLon=\{floor((mLon\_o-1)/2)+i\}, i=0,1 \quad (7)$$

By performing such calculation, the candidate calculation unit 102 can obtain a set of the candidate area mesh origin coordinates {(mLat, mLon)}, i.e., the candidate area mesh origin coordinates of all of the candidate area meshes.

However, in a case where the longitude area mesh number mLon is smaller than 0, i.e., mLon<0, a value obtained by adding the longitude area mesh division number M to the longitude area mesh number mLon is designated as the final longitude area mesh number mLon.

Moreover, in a case where the longitude area mesh number mLon is larger than the longitude area mesh division number M, i.e., mLon>M, a value obtained by subtracting the longitude area mesh division number M from the longitude area mesh number mLon is designated as the final longitude area mesh number mLon.

A specific example of derivation of the candidate area mesh origin coordinates will be described here with reference to FIGS. 21 and 22. Note that a vertical direction in the figure represents the latitude direction and that a horizontal direction in the figure represents the longitude direction in FIGS. 21 and 22.

Figure 21:
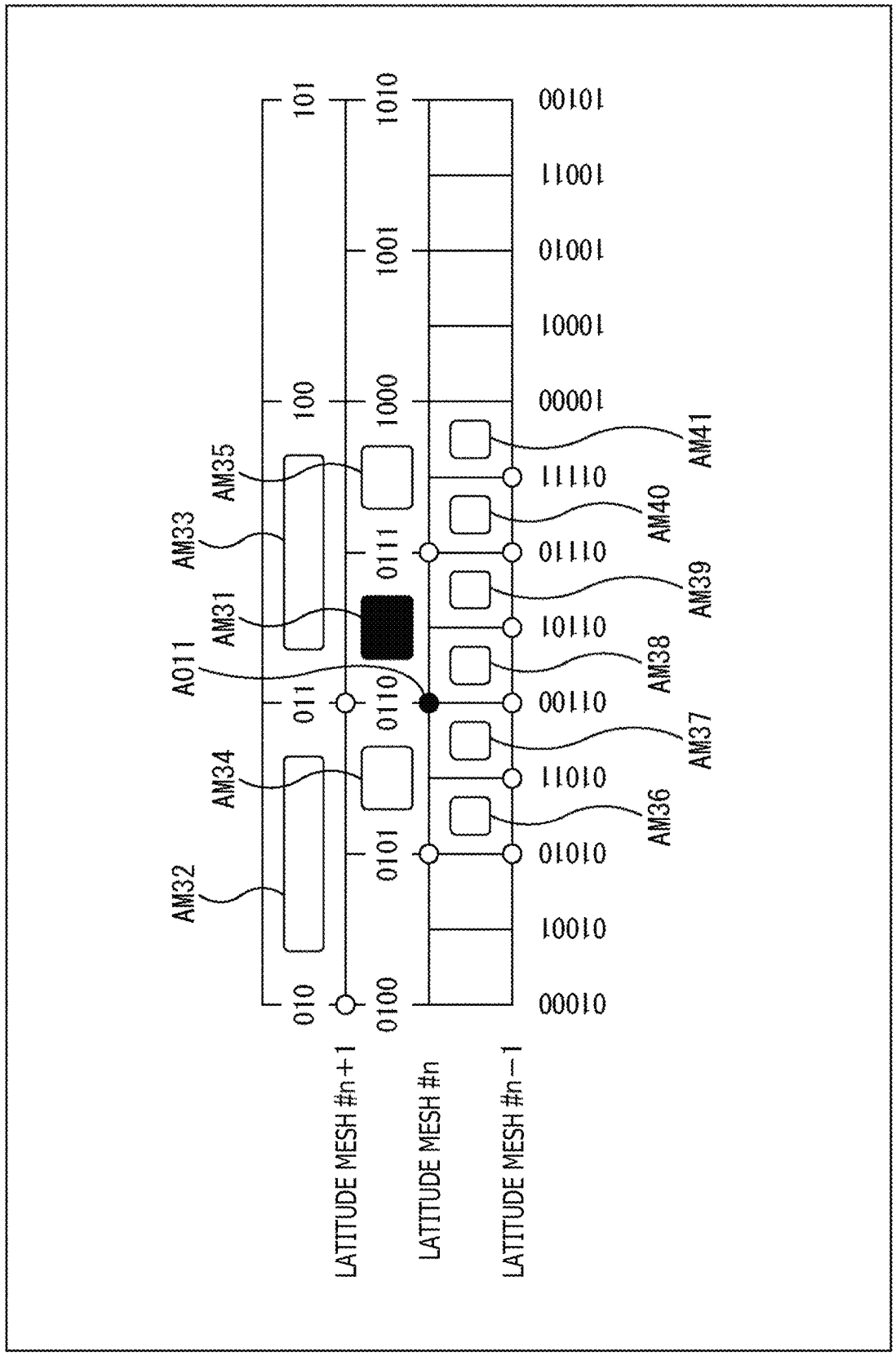
FIG. 21 is a diagram explaining a derivation example of candidate area mesh origin coordinates.
Figure 22:
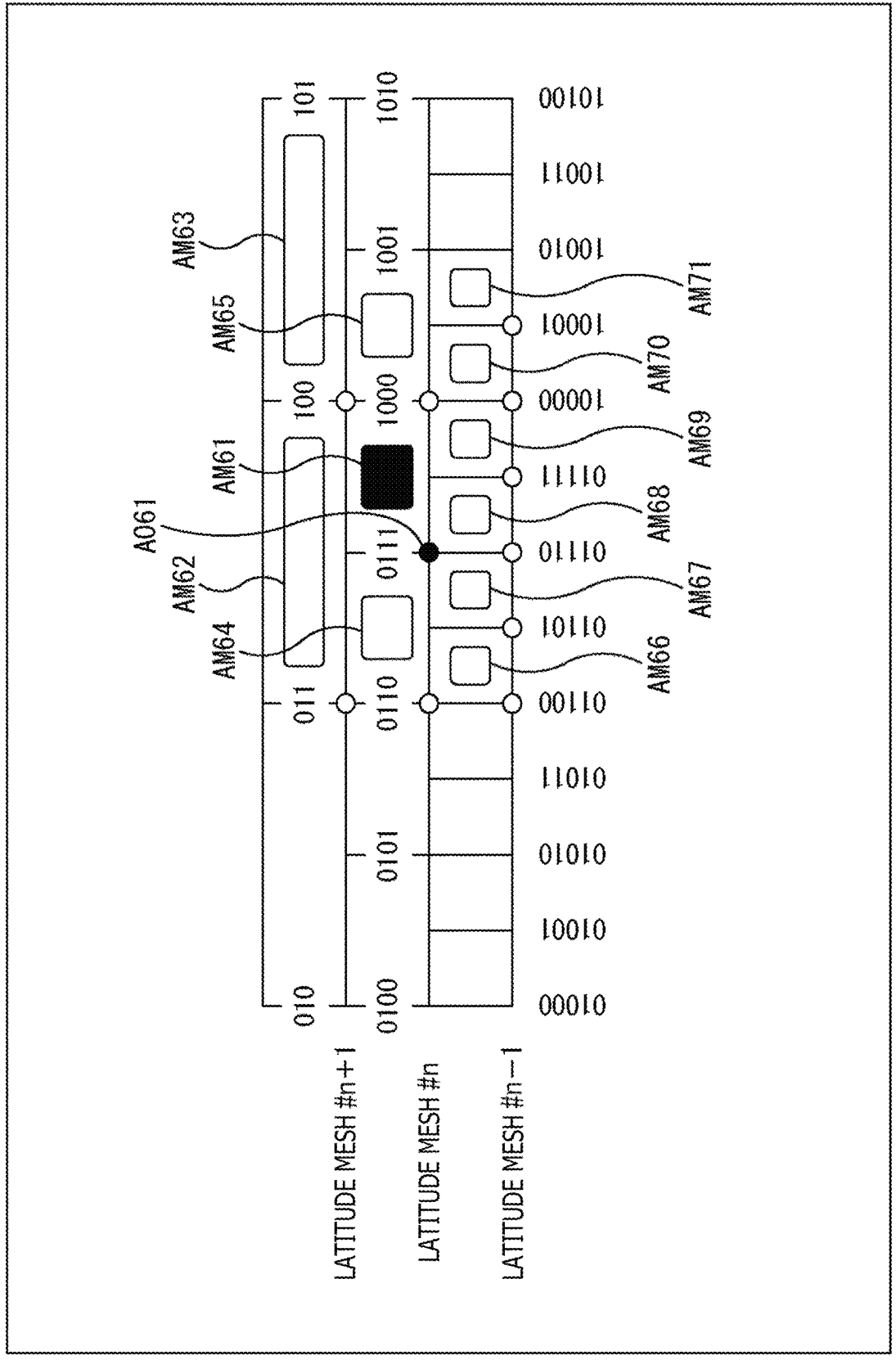
FIG. 22 is a diagram explaining a derivation example of candidate area mesh origin coordinates.

Moreover, in FIGS. 21 and 22, respective lines in the vertical direction and the horizontal direction represent a mesh, each of numerical values given in the figure represents a binary value of a longitude area mesh number of the corresponding one of the area meshes, and each of circles in the figure represents an origin of the corresponding candidate area mesh.

The example depicted in FIG. 21 will first be described.

In the example in FIG. 21, it is assumed that the reception device 61 is located in an area mesh AM31 which is disposed between a mesh #n and a mesh #n+1 arranged in the latitude direction and which has an area mesh origin at a position AO11.

It is assumed here that a real number value of the latitude area mesh number mLat_o of the area mesh AM31 is n and that a binary value of the longitude area mesh number mLon_o is 0110, i.e., a real number value of the longitude area mesh number mLon_o is 6.

In this case, as described above, latitude area mesh numbers mLat included in the set of the candidate area mesh origin coordinates {(mLat, mLon)} are latitude area mesh numbers mLat=n−1, n, n+1.

According to this example, the longitude area mesh division number at latitude corresponding to the latitude area mesh number mLat=n−1 is 32, while the longitude area mesh division number at latitude corresponding to the latitude area mesh number mLat=n is 16. In addition, the longitude area mesh division number at latitude corresponding to the latitude area mesh number mLat=n+1 is 8.

First, focusing on the latitude area mesh number mLat=n+1, the longitude area mesh division number "8" at the latitude area mesh number mLat=n+1 is smaller than the longitude area mesh division number "16" at the latitude area mesh number mLat_o=n.

Accordingly, the longitude area mesh numbers mLon corresponding to the latitude area mesh number mLat=n+1 are mLon=2, 3 on the basis of Equation (7) described above. The longitude area mesh number mLon=2 corresponds to 010 in the form of a binary value, while the longitude area mesh number mLon=3 corresponds to 011 in the form of a binary value.

As a result, an area mesh AM32 which has area mesh origin coordinates (mLat, mLon)=(n+1, 2) and an area mesh AM33 which has area mesh origin coordinates (mLat, mLon)=(n+1, 3) are designated as candidate area meshes.

Next, focusing on the latitude area mesh number mLat=n, the latitude area mesh number mLat=n is the latitude area mesh number mLat_o.

Accordingly, the longitude area mesh numbers mLon corresponding to the latitude area mesh number mLat=n are mLon=5, 6, 7 (0101, 0110, 0111 in the form of binary values) on the basis of Equation (6) described above.

As a result, an area mesh AM34, the area mesh AM31, and an area mesh AM35 which have area mesh origin coordinates (mLat, mLon)=(n, 5), (n, 6), and (n, 7), respectively, are designated as candidate area meshes.

Further, focusing on the latitude area mesh number mLat=n−1, the longitude area mesh division number "32" at the latitude area mesh number mLat=n−1 is larger than the longitude area mesh division number "16" at the latitude area mesh number mLat_o=n.

Accordingly, the longitude area mesh numbers mLon corresponding to the latitude area mesh number mLat=n−1 are mLon=10, 11, 12, 13, 14, 15 (01010, 01011, 01100, 01101, 01110, 01111 in the form of binary values) on the basis of Equation (5) described above.

As a result, area meshes AM36 to AM41 which have area mesh origin coordinates (mLat, mLon)=(n−1, 10), (n−1, 11), (n−1, 12), (n−1, 13), (n−1, 14), and (n−1, 15), respectively, are designated as candidate area meshes.

In the manner described above, 11 area meshes in total, i.e., the area meshes AM31 to AM41, are finally designated as candidate area meshes in the example depicted in FIG. 21.

Moreover, according to the example in FIG. 22, it is assumed that the reception device 61 is located in an area mesh AM61 which is disposed between a mesh #n and a mesh #n+1 arranged in the latitude direction and which has an area mesh origin at a position AO61.

It is assumed here that a real number value of the latitude area mesh number mLat_o of the area mesh AM61 is n and that a binary value of the longitude area mesh number mLon_o is 0111, i.e., a real number value of the longitude area mesh number mLon_o is 7.

In this case, latitude area mesh numbers mLat included in the set of the candidate area mesh origin coordinates {(mLat, mLon)} are latitude area mesh numbers mLat=n−1, n, n+1. Moreover, the longitude area mesh division numbers at respective degrees of latitude in the example depicted in FIG. 22 are similar to those numbers in the case depicted in FIG. 21.

First, focusing on the latitude area mesh number mLat=n+1, the longitude area mesh numbers mLon corresponding to the latitude area mesh number mLat=n+1 are mLon=3, 4 (011, 100 in the form of binary values) on the basis of Equation (7).

As a result, an area mesh AM62 and an area mesh AM63 which have area mesh origin coordinates (mLat, mLon)=(n+1, 3) and (n+1, 4), respectively, are designated as candidate area meshes.

Next, focusing on the latitude area mesh number mLat=n, the longitude area mesh numbers mLon corresponding to the latitude area mesh number mLat=n are mLon=6, 7, 8 (0110, 0111, 1000 in the form of binary values) on the basis of Equation (6) described above.

As a result, an area mesh AM64, the area mesh AM61, and an area mesh AM65 which have area mesh origin coordinates (mLat, mLon)=(n, 6), (n, 7), and (n, 8), respectively, are designated as candidate area meshes.

Further, focusing on the latitude area mesh number mLat=n−1, the longitude area mesh numbers mLon corresponding to the latitude area mesh number mLat=n−1 are mLon=12, 13, 14, 15, 16, 17 (01100, 01101, 01110, 01111, 10000, 10001 in the form of binary values) on the basis of Equation (5) described above.

As a result, area meshes AM66 to AM71 which have area mesh origin coordinates (mLat, mLon)=(n−1, 12), (n−1, 13), (n−1, 14), (n−1, 15), (n−1, 16), and (n−1, 17), respectively, are designated as candidate area meshes.

In the manner described above, 11 area meshes in total, i.e., the area meshes AM61 to AM71, are finally designated as candidate area meshes in the example depicted in FIG. 22.

In addition, a specific example of respective processing performed in the transmission process and the reception process described above will be described with reference to FIGS. 23 and 24. It is assumed here that the transmission device 11 is located in Hachijojima Island and that the reception device 61 is located in Atsugi-city, Kanagawa Prefecture.

Figure 23:
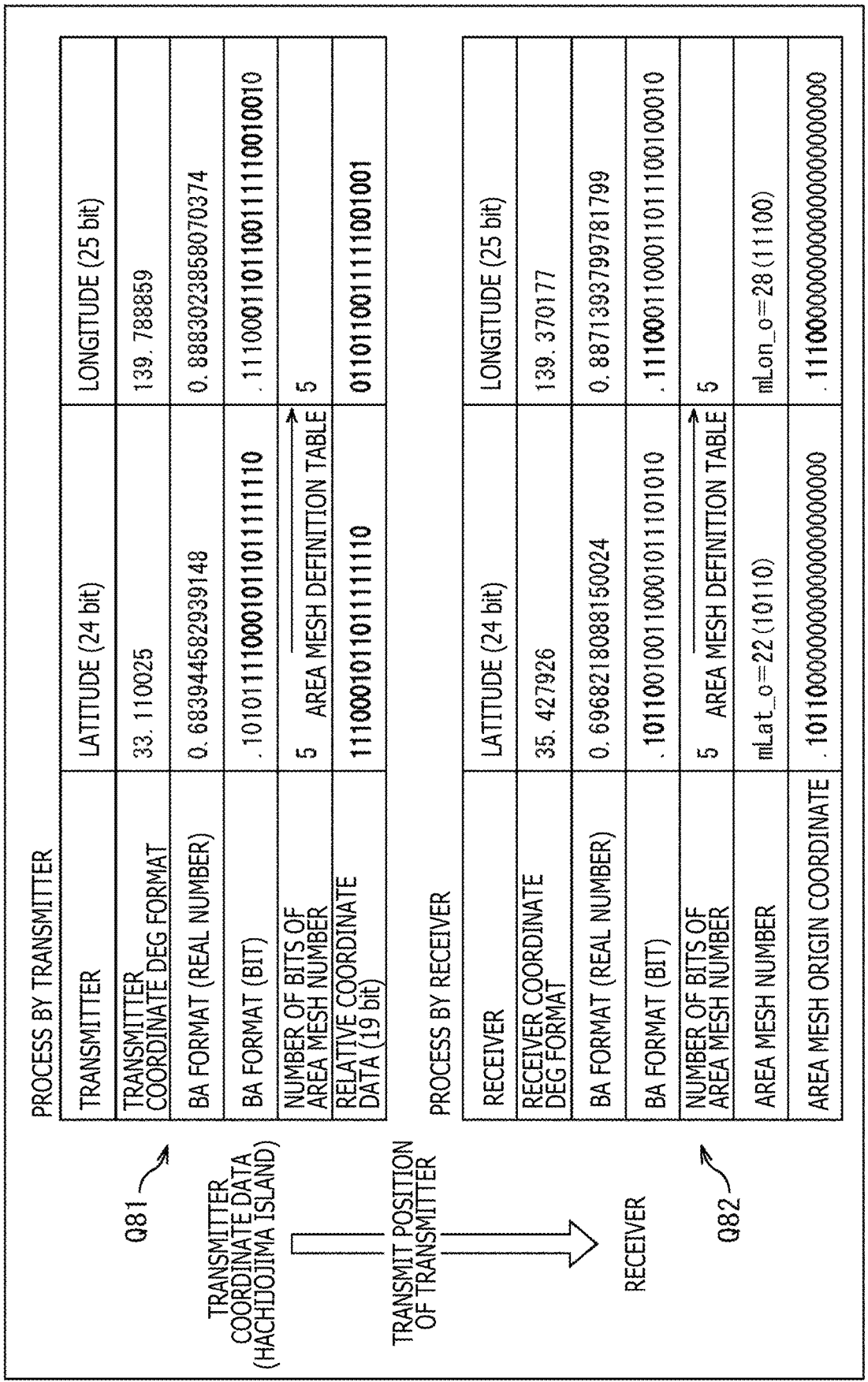
FIG. 23 is a diagram depicting an example of generation of relative coordinate data and restoration of absolute coordinate data.

In FIG. 23, information associated with a position of the transmission device 11 (transmitter) is presented in a part indicated by an arrow Q81. Specifically, the column "TRANSMITTER COORDINATE DEG-FORMAT" contains DEG-format latitude and longitude indicating the position of the transmission device 11. The DEG-format latitude and longitude indicating the position of the transmission device 11 here are 33.110025 and 139.788859, respectively.

In addition, a real number value of BA-format absolute coordinate data and a binary value of BA-format absolute coordinate data each indicating the position of the transmission device 11 are contained in the columns of "BA FORMAT (REAL NUMBER)" and "BA FORMAT (BIT)", respectively, in the part indicated by the arrow Q81.

Specifically, for example, a binary value of absolute latitude coordinate data indicating the position of the transmission device 11 is "1010111100010110111110", and a binary value of the absolute longitude coordinate data indicating the position of the transmission device 11 is "1110001101100111110010010".

Moreover, the number of bits of an area mesh number and a binary value of the relative coordinate data are contained in the columns of "NUMBER OF BITS OF AREA MESH NUMBER" and "RELATIVE COORDINATE DATA", respectively, in the part indicated by the arrow Q81.

The number of bits of the latitude area mesh number here is 5. Accordingly, in the transmission process, 19 bits of the absolute latitude coordinate data ranging from the high-order 6th bit to the 24th bit are extracted and designated as relative latitude coordinate data "1110001011011111110".

Similarly, the number of bits of the longitude area mesh number is 5. This number "5" of bits of the longitude area mesh number is specified with reference to the area mesh definition table presented in FIG. 9. The latitude area mesh number here is "10101" (21 in the form of a real number value) which corresponds to the high-order 5 bits of the absolute latitude coordinate data. Accordingly, the number of bits of the longitude area mesh number "5" is obtained with reference to the area mesh definition table presented in FIG. 9.

According to the example in FIG. 23, thus, high-order 19 bits ranging from the 6th bit to the 24th bit of the absolute longitude coordinate data are extracted, and designated as relative longitude coordinate data "0110110011111001001".

In the transmission process, the relative latitude coordinate data and the relative longitude coordinate data thus obtained are transmitted to the reception device 61 (receiver).

Moreover, in FIG. 23, information associated with a position of the reception device 61 (receiver) is presented in a part indicated by an arrow Q82. Specifically, the column "RECEIVER COORDINATE DEG FORMAT" contains DEG-format latitude and longitude indicating the position of the reception device 61.

The DEG-format latitude and longitude indicating the position of the reception device 61 here are 35.427926 and 139.370177, respectively.

In addition, a real number value of BA-format absolute coordinate data and a binary value of BA-format absolute coordinate data each indicating the position of the reception device 61 are contained in the columns of "BA FORMAT (REAL NUMBER)" and "BA FORMAT (BIT)", respectively, in the part indicated by the arrow Q82.

Specifically, for example, a binary value of absolute latitude coordinate data indicating the position of the reception device 61 is "10110010011000101101010", and a binary value of absolute longitude coordinate data indicating the position of the reception device 61 is "111000110001101110010010".

Moreover, the number of bits of an area mesh number, an area mesh number, and area mesh origin coordinates are contained in the columns of "NUMBER OF BITS OF AREA MESH NUMBER", "AREA MESH NUMBER", and "AREA MESH ORIGIN COORDINATE", respectively, in the part indicated by the arrow Q82.

The number of bits of the latitude area mesh number here is 5. Accordingly, in the reception process, high-order 5 bits of the absolute latitude coordinate data are extracted and designated as a latitude area mesh number mLat_o=22 (10110 in the form of a binary value). As a result, a latitude coordinate of the area mesh origin is obtained from the latitude area mesh number.

On the other hand, concerning the longitude direction, the number of bits of a longitude area mesh number is specified as "5" from the latitude area mesh number "22" with reference to the area mesh definition table presented in FIG. 9. Then, high-order 5 bits of the absolute longitude coordinate data are extracted, and designated as a longitude area mesh number mLon_o=28 (11100 in the form of a binary value). As a result, a longitude coordinate of the area mesh origin is obtained from the longitude area mesh number.

The reception device 61 further generates candidate data for each of the candidate area meshes on the basis of the area mesh origin coordinates obtained in the manner described above, i.e., the latitude area mesh number mLat_o=22 and the longitude area mesh number mLon_o=28, as depicted in FIG. 24.

According to the example depicted in FIG. 24, information associated with the latitude direction of candidate data is contained in a part indicated by an arrow Q91, while information associated with the longitude direction of candidate data is contained in a part indicated by an arrow Q92. In addition, a distance from the reception device 61 (receiver) to a position indicated by candidate data is contained in a part indicated by an arrow Q93.

Numbers indicating the respective candidate area meshes are contained in the column "COORDINATE CANDIDATE" in the part indicated by the arrow Q91. It is apparent here that candidate data has been obtained for each of nine candidate area meshes in total, i.e., candidate area meshes from 0 to 8.

Moreover, in the part indicated by the arrow Q91, a real number value of a latitude area mesh number of candidate data and a latitude coordinate constituting candidate area mesh origin coordinates, i.e., a binary value of a latitude area mesh number, are contained in the columns of "LATITUDE AREA MESH NUMBER" and "ORIGIN LATITUDE", respectively.

In addition, relative latitude coordinate data of candidate data and DEG-format latitude corresponding to a position indicated by candidate data are contained in the columns of "RELATIVE LATITUDE COORDINATE DATA" and "ABSOLUTE LATITUDE (DEG)", respectively, in the part indicated by the arrow Q91. This DEG-format latitude is latitude information constituting the candidate position information described above.

On the other hand, in the part indicated by the arrow Q92, a real number value of a longitude area mesh number of candidate data and a longitude coordinate constituting candidate area mesh origin coordinates, i.e., a binary value of the longitude area mesh number, are contained in the columns of "LONGITUDE AREA MESH NUMBER" and "ORIGIN LONGITUDE", respectively.

In addition, relative longitude coordinate data of candidate data and DEG-format longitude corresponding to a position indicated by candidate data are contained in the columns of "RELATIVE LONGITUDE COORDINATE DATA" and "ABSOLUTE LONGITUDE (DEG)", respectively, in the part indicated by the arrow Q92. This DEG-format longitude is longitude information constituting the candidate position information described above.

Nine pieces of candidate data depicted in FIG. 24 are obtained from the relative coordinate data associated with the transmission device 11 and the absolute coordinate data associated with the reception device 61 both depicted in FIG. 23.

After the candidate data is obtained, the reception device 61 obtains a distance from the reception device 61 to a position indicated by the candidate data (candidate position information) as indicated by the arrow Q93, on the basis of DEG-format position information indicating the position of the reception device 61 and DEG-format candidate position information obtained by conversion of the candidate data.

Thereafter, the candidate position information corresponding to the shortest obtained distance in the plural pieces of candidate position information is designated as the final DEG-format position information indicating the position of the transmission device 11. In this example, the candidate position information corresponding to a distance of 260.0 km is selected as the DEG-format position information indicating the position of the transmission device 11.

Accordingly, coordinates (latitude, longitude) indicating the position of the transmission device 11 are determined as (33.110025, 139.788859). It is apparent that the position indicating the transmission device 11 has been correctly restored on the basis of a comparison between the position information thus obtained and the DEG-format position information indicating the position of the transmission device 11 and specified by the arrow Q81 in FIG. 23.

<Modifications>
<Other Examples of Division into Area Meshes>

Note that described above has been division of the ground surface corresponding to the target region performed in the longitude direction in the manner as depicted in FIG. 8. However, division in the longitude direction is not limited to this example, and may be performed in any manner. Other division examples in the longitude direction will hereinafter be described with reference to FIGS. 25 to 28.

Figure 25:
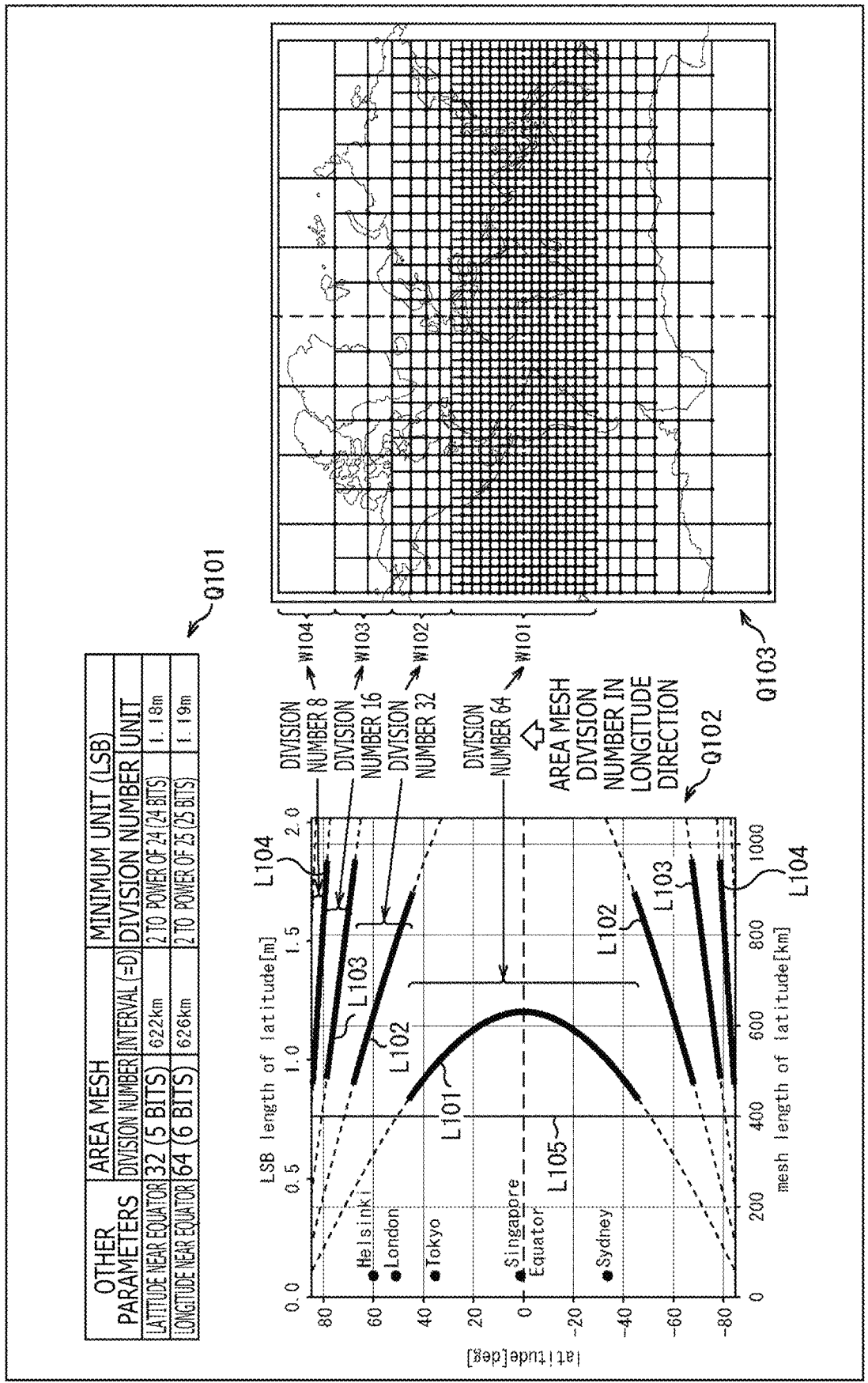
FIG. 25 is a diagram depicting an example of division into area meshes.

First, in a first example, division in the longitude direction may be performed while the receivable maximum distance r<200 km and the threshold TH=400 km are set, as presented in FIG. 25, for example.

In FIG. 25, basic parameters are presented in a part indicated by an arrow Q101, mesh intervals at respective degrees of latitude are presented in a part indicated by an arrow Q102, and respective area meshes on the ground surface are presented in a part indicated by an arrow Q103.

Note that respective parameters contained in a part indicated by the arrow Q101 are the same as the parameters indicated by the arrow Q41 in FIG. 8. Accordingly, explanation of these parameters is omitted.

By determining the area mesh division number in each of the latitude direction and the longitude direction near the equator and performing the division number determination process presented in FIG. 7 according to the determination, the longitude area mesh division number M at each degree of latitude is determined as indicated by the arrow Q102.

In the part indicated by the arrow Q102, a vertical axis represents DEG-format latitude. Moreover, in the part indicated by the arrow Q102, an upper horizontal axis in the figure represents an interval of the ground surface per minimum unit (LSB) of absolute longitude coordinate data, while a lower horizontal axis in the figure represents a mesh interval in the longitude direction.

A curved line L101 represents a mesh interval in the longitude direction at each degree of latitude in a case where the longitude area mesh division number M=64 is set, while a curved line L102 represents a mesh interval in the longitude direction at each degree of latitude in a case where the longitude area mesh division number M=32 is set.

Similarly, a curved line L103 represents a mesh interval in the longitude direction at each degree of latitude in a case where the longitude area mesh division number M=16 is set, while a curved line L104 represents a mesh interval in the longitude direction at each degree of latitude in a case where the longitude area mesh division number M=8 is set. In addition, a straight line L105 represents the threshold TH=400 km.

A part expressed by a thick line in each of the curved lines L101 to L104 here indicates a range (latitude section) corresponding to the longitude area mesh division number M actually determined, and each of the mesh intervals in the longitude direction at respective degrees of latitude in correspondence with the actual longitude area mesh division number M is longer than the threshold TH.

A result indicated by an arrow Q103 is obtained by dividing the ground surface of the globe corresponding to the target region into area meshes on the basis of the longitude area mesh division number M determined for each degree of latitude in the manner described above and the latitude area mesh division number "32".

In the part indicated by the arrow Q103, one quadrangle represents one area mesh. In this example, the latitude area mesh division number is always fixed for each degree of latitude and longitude. However, it is apparent that the longitude area mesh division number M varies for each degree of latitude.

For example, the longitude area mesh division number M is 64 in a region W101 near the equator, and the longitude area mesh division number M is 32 in a region W102 on the upper side of the region W101 in the figure. Moreover, the longitude area mesh division number M is 16 in a region W103 on the upper side of the region W102 in the figure, and the longitude area mesh division number M is 8 in a region W104 on the upper side of the region W103 in the figure.

It is apparent from a comparison between the example in FIG. 25 and the example in FIG. 8 that a region where the longitude area mesh division number M=64 is larger in size in the example in FIG. 25 and that the longitude area mesh division number is larger as a whole in the example in FIG. 25. Moreover, in the example in FIG. 25, variations of the ground surface interval per minimum unit (LSB) of the absolute longitude coordinate data for each degree of latitude are more reduced than those in the example depicted in FIG. 8.

In a case where division into area meshes is performed in the manner depicted in FIG. 25, an area mesh definition table presented in FIG. 26 is obtained. Note that respective columns in FIG. 26 are similar to those in FIG. 9. Accordingly, explanation of these columns is omitted.

Figure 27:
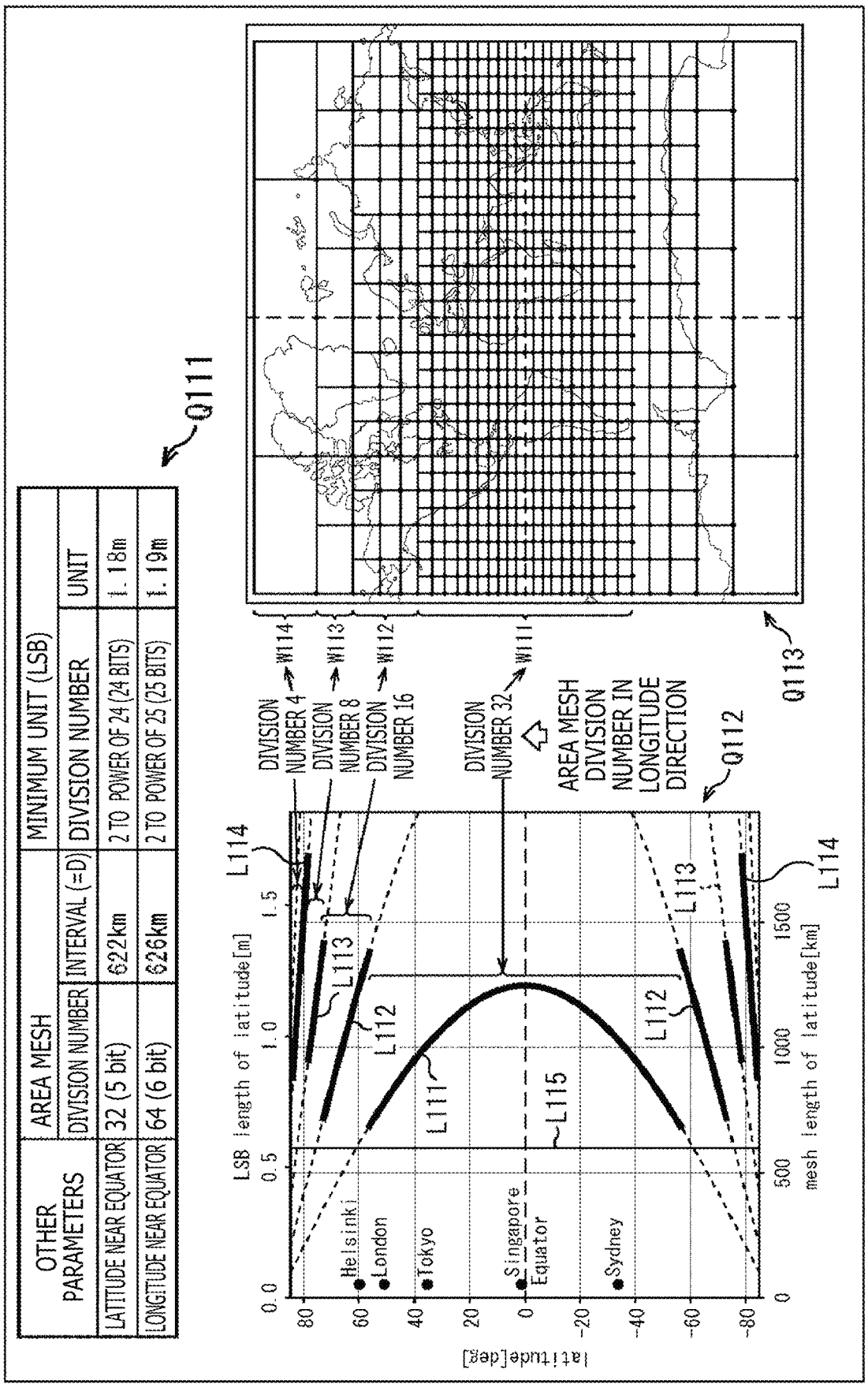
FIG. 27 is a diagram depicting an example of division into area meshes.

Moreover, in a second example, division in the longitude direction may be performed while the receivable maximum distance r<300 km and the threshold TH=600 km are set, as presented in FIG. 27, for example.

In FIG. 27, basic parameters are presented in a part indicated by an arrow Q111, mesh intervals at respective degrees of latitude are presented in a part indicated by an arrow Q112, and respective area meshes on the ground surface are presented in a part indicated by an arrow Q113.

Note that respective parameters contained in a part indicated by the arrow Q111 are basically the same as the parameters indicated by the arrow Q41 in FIG. 8, but are different from the parameters in the example in FIG. 8 only in a point that the longitude area mesh division number near the equator is 32.

In this example, the longitude area mesh number has 5 bits, while relative longitude coordinate data contained in transmission data and transmitted is 20-bit data.

By determining the area mesh division number in each of the latitude direction and the longitude direction near the equator and performing the division number determination process presented in FIG. 7 according to the determination, the longitude area mesh division number M at each degree of latitude is determined as indicated by the arrow Q112.

In the part indicated by the arrow Q112, a vertical axis represents DEG-format latitude. Moreover, in the part indicated by the arrow Q112, an upper horizontal axis in the figure represents an interval of the ground surface per minimum unit (LSB) of absolute longitude coordinate data, while a lower horizontal axis in the figure represents a mesh interval in the longitude direction.

A curved line L111 represents a mesh interval in the longitude direction at each degree of latitude in a case where the longitude area mesh division number M=32 is set, while a curved line L112 represents a mesh interval in the longitude direction at each degree of latitude in a case where the longitude area mesh division number M=16 is set.

Similarly, a curved line L113 represents a mesh interval in the longitude direction at each degree of latitude in a case where the longitude area mesh division number M=8 is set, while a curved line L114 represents a mesh interval in the longitude direction at each degree of latitude in a case where the longitude area mesh division number M=4 is set. In addition, a straight line L115 represents the threshold TH=600 km.

A part expressed by a thick line in each of the curved lines L111 to L114 here indicates a range (latitude section) corresponding to the longitude area mesh division number M actually determined, and each of the mesh intervals in the longitude direction at respective degrees of latitude in correspondence with the actual longitude area mesh division number M is longer than the threshold TH.

A result indicated by an arrow Q113 is obtained by dividing the ground surface of the globe corresponding to the target region into area meshes on the basis of the longitude area mesh division number M determined for each degree of latitude in the manner described above and the latitude area mesh division number "32".

In the part indicated by the arrow Q113, one quadrangle represents one area mesh. In this example, the latitude area mesh division number is always fixed for each degree of latitude and longitude. However, it is apparent that the longitude area mesh division number M varies for each degree of latitude.

In this example, it is apparent that a region where the longitude area mesh division number M is set to 32 is large in size. In the example depicted in FIG. 27, variations of the ground surface interval per minimum unit (LSB) of the absolute longitude coordinate data for each degree of latitude are further reduced than those in the example depicted in FIG. 25.

In a case where division into area meshes is performed in the manner depicted in FIG. 27, an area mesh definition table presented in FIG. 28 is obtained. Note that respective columns in FIG. 28 are similar to those in FIG. 9. Accordingly, explanation of these columns is omitted.

In addition, while described above has been the example where the absolute latitude coordinate data and the absolute longitude coordinate data have 24 bits and 25 bits, respectively, absolute coordinate data in the present technology may have any number of bits.

For example, the interval of the ground surface per minimum unit (LSB) becomes shorter as the number of bits of absolute coordinate data increases. In this manner, coordinate accuracy (resolution) can be raised. On the contrary, the interval of the ground surface per minimum unit (LSB) becomes longer as the number of bits of absolute coordinate data decreases. In this manner, transmission data to be transmitted can be limited to only rough coordinates.

Accordingly, an appropriate number of bits is allowed to be determined according to use applications. Specifically, absolute coordinate data can be obtained with any coordinate accuracy by determining an appropriate bit width of absolute coordinate data.

Moreover, in the example described above, the longitude area mesh division number varies according to each degree of latitude, while the latitude area mesh division number is uniform (fixed). However, the latitude area mesh division number may also vary according to each degree of latitude (a position in the latitude direction).

In this case, the latitude area mesh division number varies for each range of the ground surface corresponding to the target region in the latitude direction, for example. In such a manner, variations of the ground surface interval per minimum unit (LSB) of the absolute longitude coordinate data for each degree of latitude can be further reduced.

Moreover, coordinates at a position nearer the pole are representable when a larger latitude area mesh division number is set near the pole. For example, according to the embodiment described above, positions of latitude from −84.375 degrees to 84.375 degrees can be represented by absolute latitude coordinate data as apparent from the area mesh definition table presented in FIG. 9. However, a position still nearer the pole is representable in the form of absolute latitude coordinate data when a still larger latitude area mesh division number is set near the pole.

Further, the reception device 61 specifies area meshes designated as candidate area meshes by calculating Equation (5) to Equation (7) as appropriate as described with reference to FIGS. 21 and 22, for example. However, not all of these area meshes but only some of them may be designated as candidate area meshes, according to the position of the reception device 61 within the area mesh.

Specifically, when the reception device 61 is located at a position in the right half part (larger degree of longitude side) in the longitude direction within the area mesh, for example, designation of the area meshes located on the left side as viewed from the reception device 61, as candidate area meshes, may be prohibited. In further detail, suppose that the reception device 61 is located within the area mesh AM31 near the area mesh AM35 in the example depicted in FIG. 21, for example. In that case, designation of such area meshes as the area mesh AM32, the area mesh AM34, the area mesh AM36, and the area mesh AM37, as candidate area meshes, may be prohibited.

Similarly, when the reception device 61 is located at a position in the upper half part (larger degree of latitude side) in the latitude direction within the area mesh, for example, designation of the area meshes located on the lower side as viewed from the reception device 61, as candidate area meshes, may also be prohibited. In such a manner, a volume processed by the reception device 61 can be reduced by prohibiting designation of area meshes located on the side far from the reception device 61, as candidate area meshes, according to the position of the reception device 61 within the area mesh.

Further, described above has been the example where one of pieces of candidate position information obtained for plural candidate area meshes is selected as position information indicating a correct position of the transmission device 11. However, correct absolute coordinate data indicating the position of the transmission device 11 may be restored by first specifying the area mesh containing the transmission device 11 and then generating absolute coordinate data for the specified area mesh.

For example, in some wireless communication, time synchronization may be established by using GNSS information between the transmission device 11 and the reception device 61 depending on a communication type. An approximate distance from the transmission device 11 to the reception device 61 can be estimated on the basis of the time synchronization.

Specifically, in a case where time synchronization is established, for example, the reception device 61 is capable of recognizing transmission time (timing) of transmission data transmitted from the transmission device 11. Accordingly, the reception device 61 is capable of estimating a propagation distance of transmission data, i.e., an approximate distance from the transmission device 11 to the reception device 61, on the basis of transmission time of transmission data and reception time at which the transmission data is actually received.

In such a case, the candidate calculation unit 102 or the like of the reception device 61 is capable of specifying (estimating) the area mesh containing the transmission device 11, by comparing a distance obtained by estimation and a distance from the reception device 61 to a position indicated by candidate data, for example, on the basis of the estimated approximate distance from the transmission device 11 to the reception device 61.

Further, after the area mesh containing the transmission device 11 is specified, area mesh origin coordinates of the specified area mesh are obtained. Thereafter, absolute coordinate data indicating the position of the transmission device 11 is generated on the basis of the area mesh origin coordinates and relative coordinate data extracted from the received transmission data. In such a manner, the processing volume can be further reduced than that in a case where plural pieces of candidate data are obtained.

In addition, as a method for obtaining the approximate distance from the transmission device 11 to the reception device 61, a reception level (RSSI (Received Signal Strength Indication)) at the time of reception of such signals as transmission data may be used, other than using time synchronization. For example, a propagation distance of signals, i.e., an approximate distance from the transmission device 11 to the reception device 61, can be estimated using a radio wave propagation model on the basis of a reception level of signals calculated by a demodulation process at the time of signal reception.

As described above, according to the present technology, a coordinate system covering the ground surface of the whole globe except for regions near the poles can be uniformly handled using a small number of bits by generating BA-format absolute coordinate data where the longitude area mesh division number varies according to each degree of latitude.

For example, when a position within one of some local regions, such as countries and districts, produced by dividing the ground surface of the globe to define a local coordinate system is represented in this local coordinate system, the number of bits of position information increases. In contrast, according to the present technology, a position on the ground surface of the globe can be represented with sufficient coordinate accuracy and a reduced number of bits without the necessity of defining local coordinates such as countries and districts.

Moreover, according to the present technology, not only variations of a change width of longitude coordinate accuracy, i.e., an interval of the ground surface per minimum unit (LSB), but also the number of bits of position information can be reduced, by varying the longitude area mesh division number according to each degree of latitude.

Further, according to the present technology, the propagation distance of transmission data, i.e., the receivable maximum distance r, is determined by communication performance of the transmission device 11 or the like. Accordingly, the number of bits of relative coordinate data can be minimized by determining the area mesh division number (the number of bits of the area mesh number) according to the receivable maximum distance r.

In addition, according to the present technology, such processes as a process for specifying the area mesh containing the transmission device 11 by performing a cooperative operation with other reception devices nearby are not required. Accordingly, absolute coordinate data indicating the position of the transmission device 11 can be restored (derived) by using only the single reception device 61.

<Configuration Example of Computer>

Meanwhile, a series of processes described above may be executed either by hardware or by software. In a case where the series of processes is executed by software, a program constituting the software is installed in a computer. Examples of the computer here include a computer incorporated in dedicated hardware and a computer capable of executing various functions under various programs installed in the computer, such as a general-purpose personal computer.

FIG. 29 is a block diagram depicting a hardware configuration example of a computer which executes the series of processes described above under a program.

The computer includes a CPU (Central Processing Unit) 501, a ROM (Read Only Memory) 502, and a RAM (Random Access Memory) 503 connected to each other via a bus 504.

An input/output interface 505 is further connected to the bus 504. An input unit 506, an output unit 507, a recording unit 508, a communication unit 509, and a drive 510 are connected to the input/output interface 505.

The input unit 506 includes a keyboard, a mouse, a microphone, an imaging element, and others. The output unit 507 includes a display, a speaker, and others. The recording unit 508 includes a hard disk, a non-volatile memory, and others. The communication unit 509 includes a network interface and others. The drive 510 drives a removable recording medium 511 such as a magnetic disk, an optical disk, a magneto-optical disk, and a semiconductor memory.

According to the computer configured as described above, for example, the CPU 501 loads a program recorded in the recording unit 508 into the RAM 503 via the input/output interface 505 and the bus 504, and executes the loaded program to perform the series of processes described above.

For example, the program executed by the computer (CPU 501) is allowed to be recorded in the removable recording medium 511 as a package medium or the like and provided in this form. In addition, the program is allowed to be provided via a wired or wireless transfer medium, such as a local area network, the Internet, and digital satellite broadcasting.

According to the computer, the program is allowed to be installed into the recording unit 508 via the input/output interface 505 from the removable recording medium 511 attached to the drive 510. Moreover, the program is allowed to be received by the communication unit 509 via a wired or wireless transfer medium and installed into the recording unit 508. Further, the program is allowed to be installed in the ROM 502 or the recording unit 508 beforehand.

Note that the program to be executed by the computer may be a program where processes are performed in time series in the order described in the present description, or a program where processes are performed in parallel or at a necessary timing, such as an occasion of a call.

Further, embodiments of the present technology are not limited to the embodiment described above, and may be modified in various manners without departing from the scope of the subject matters of the present technology.

For example, the present technology is allowed to have a configuration of cloud computing where one function is shared by plural devices and processed by the devices operating in cooperation with each other via a network.

Further, each of the steps described with reference to the above flowcharts is allowed to be executed by one device, or shared and executed by plural devices.

Further, in a case where one step contains plural processes, the plural processes contained in the one step are allowed to be executed by one device, or shared and executed by plural devices.

In addition, the present technology may also have the following configurations.

(1)

An information processing apparatus including:

an acquisition unit that acquires first position information indicating a position of a target object in a target region; and a generation unit that generates, on the basis of the first position information, second position information including area mesh information that indicates a target area mesh containing the target object and included in plural area meshes produced by dividing the target region in a first direction and a second direction such that a division number in the second direction varies for each position in the first direction in the target region and relative position information that indicates a position of the target object in the target area mesh.

(2)

The information processing apparatus according to (1), in which the target region is a curved surface.

(3)

The information processing apparatus according to (1) or (2), in which the area mesh information includes information that indicates a position of the target area mesh in the target region.

(4)

The information processing apparatus according to any one of (1) to (3), in which the second position information includes first absolute position information that includes first area mesh information as the area mesh information indicating a position of the target area mesh in the first direction in the target region and first relative position information as the relative position information indicating a position of the target object in the first direction in the target area mesh and added to the first area mesh information, the first absolute position information indicating an absolute position of the target object in the first direction in the target region, and second absolute position information that includes second area mesh information as the area mesh information indicating a position of the target area mesh in the second direction in the target region and second relative position information as the relative position information indicating a position of the target object in the second direction in the target area mesh and added to the second area mesh information, the second absolute position information indicating an absolute position of the target object in the second direction in the target region.

(5)

The information processing apparatus according to (4), in which the number of bits of the second area mesh information varies according to the division number of the target region in the second direction.

(6)

The information processing apparatus according to (4) or (5), in which each of the first relative position information and the second relative position information has the number of bits determined beforehand.

(7)

The information processing apparatus according to any one of (4) to (6), in which each of the first absolute position information and the second absolute position information includes unsigned binary fixed-point information.

(8)

The information processing apparatus according to any one of (4) to (7), in which the first absolute position information is information that indicates latitude of the target object, and the second absolute position information is information that indicates longitude of the target object.

(9)

The information processing apparatus according to any one of (1) to (8), in which each of a division number of the target region in the first direction and the division number of the target region in the second direction is a power of 2.

(10)

The information processing apparatus according to any one of (1) to (9), in which the division number of the target region in the first direction varies according to a position in the first direction in the target region.

(11)

The information processing apparatus according to any one of (4) to (8), further including:

a communication unit that transmits the first relative position information and the second relative position information.

(12)

The information processing apparatus according to any one of (4) to (8), in which the target object includes the information processing apparatus, a communication unit that receives the first relative position information and the second relative position information both associated with a different target object is further included, and the generation unit generates the second position information associated with the different target object, on the basis of the first area mesh information and the second area mesh information associated with the target object and the first relative position information and the second relative position information associated with the different target object.

(13)

The information processing apparatus according to (12), in which the generation unit generates, as a candidate of the second position information associated with the different target object, the second position information associated with the different target object on an assumption that the different target object is present in the area mesh included in the target area mesh and plural area meshes adjacent to the target area mesh, and the generation unit designates, as a final second position information associated with the different target, the candidate included in plural candidates and indicating a position at a shortest distance from the target object.

(14)

The information processing apparatus according to (12) or (13), in which a distance from the target object to the different target object is shorter than a half of a length of the target area mesh in the first direction or a half of a length of the target area mesh in the second direction.

(15)

An information processing method performed by an information processing apparatus, the information processing method including:

acquiring first position information indicating a position of a target object in a target region; and generating, on the basis of the first position information, second position information including area mesh information that indicates a target area mesh containing the target object and included in plural area meshes produced by dividing the target region in a first direction and a second direction such that a division number in the second direction varies for each position in the first direction in the target region and relative position information that indicates a position of the target object in the target area mesh.

(16)

A program causing a computer to execute a process including steps of:

acquiring first position information indicating a position of a target object in a target region; and generating, on the basis of the first position information, second position information including area mesh information that indicates a target area mesh containing the target object and included in plural area meshes produced by dividing the target region in a first direction and a second direction such that a division number in the second direction varies for each position in the first direction in the target region and relative position information that indicates a position of the target object in the target area mesh.

REFERENCE SIGNS

11: Transmission device
21: Measurement module
22: Acquisition unit
23: Data generation unit
25: Communication unit
31: Latitude data generation unit
32: Longitude data generation unit
33: Transmission data generation unit
61: Reception device
91: Measurement module
92: Acquisition unit
93: Communication unit
95: Generation unit
101: Data generation unit
102: Candidate calculation unit
103: Conversion unit
104: Selection unit

The invention claimed is:

1. An information processing apparatus comprising:
an antenna; and
circuitry including a CPU that is configured by execution of computer readable instructions to
  acquire self-position information indicating a self-position of the information processing apparatus in a target region; and
  generate, based on the self-position information, absolute position information including area mesh information that indicates a position of a target area mesh containing the information processing apparatus among plural area meshes defined by dividing the target region in a first direction and a second direction such that a division number in the second direction varies for each dividing position in the first direction in the target region, and relative position information that indicates a position of the information processing apparatus in the target area mesh, wherein
the absolute position information includes
  first absolute position information that indicates an absolute position of the information processing apparatus in the first direction in the target region, the first absolute position information including first area mesh information that indicates a position of the target area mesh in the first direction in the target region and first relative position information that indicates a position of the information processing apparatus in the first direction in the target area mesh, and
  second absolute position information that indicates an absolute position of the information processing apparatus in the second direction in the target region, the second absolute position information including second area mesh information that indicates a position of the target area mesh in the second direction in the target region and second relative position information that indicates a position of the information processing apparatus in the second direction in the target area mesh, and wherein
the circuitry is further configured to
  receive through the antenna other first relative position information and other second relative position information of a target object both transmitted from a transmitter of the target object, a combination of the antenna and the transmitter having a maximum communication distance R within which the other first relative position information and the other second relative position information of the target object transmitted from the transmitter are receivable through the antenna, and the maximum communication distance R of the combination of the antenna and the transmitter meeting a condition that D is longer than 2R where D is a length of a side of the target area mesh, and
  generate absolute position information of the target object, based on the first area mesh information and the second area mesh information of the information processing apparatus and the other first relative position information and the other second relative position information of the target object.

2. The information processing apparatus according to claim 1, wherein the target region is a curved surface.

3. The information processing apparatus according to claim 1, wherein the area mesh information includes information that indicates a position of the target area mesh in the target region.

4. The information processing apparatus according to claim 1, wherein a quantity of bits of the second area mesh information varies according to the division number of the target region in the second direction.

5. The information processing apparatus according to claim 1, wherein each of the first relative position information and the second relative position information has a predetermined number of bits.

6. The information processing apparatus according to claim 1, wherein each of the first absolute position information and the second absolute position information includes unsigned binary fixed-point information.

7. The information processing apparatus according to claim 1, wherein
the first absolute position information is information that indicates latitude of the information processing apparatus, and
the second absolute position information is information that indicates longitude of the information processing apparatus.

8. The information processing apparatus according to claim 1, wherein each of a division number of the target region in the first direction and a division number of the target region in the second direction is a power of 2.

9. The information processing apparatus according to claim 1, wherein a division number of the target region in the first direction varies according to a position in the first direction in the target region.

10. The information processing apparatus according to claim 1, wherein
the circuitry is further configured to generate plural candidates of the absolute position information of the target object on an assumption that the target object is present in one of the target area mesh and plural area meshes adjacent to the target area mesh, and
the circuitry is further configured to designate, as a final absolute position information of the target object, one of the plural candidates of the absolute position information that indicates a position nearest to the information processing apparatus.

11. The information processing apparatus according to claim 1, wherein a distance from the information processing apparatus to the target object is shorter than a half of a length of the target area mesh in the first direction or a half of a length of the target area mesh in the second direction.

12. An information processing method performed by an information processing apparatus that has an antenna, the information processing method comprising:
acquiring self-position information indicating a self-position of the information processing apparatus in a target region; and
generating, on a basis of the self-position information, absolute position information including area mesh information that indicates a position of a target area mesh containing the information processing apparatus among plural area meshes defined by dividing the target region in a first direction and a second direction such that a division number in the second direction varies for each dividing position in the first direction in the target region, and relative position information that indicates a position of the information processing apparatus in the target area mesh, wherein
the absolute position information includes
first absolute position information that indicates an absolute position of the information processing apparatus in the first direction in the target region, the first absolute position information including first area mesh information that indicates a position of the target area mesh in the first direction in the target region and first relative position information that indicates a position of the information processing apparatus in the first direction in the target area mesh, and
second absolute position information that indicates an absolute position of the information processing apparatus in the second direction in the target region, the second absolute position information including second area mesh information that indicates a position of the target area mesh in the second direction in the target region and second relative position information that indicates a position of the information processing apparatus in the second direction in the target area mesh, and wherein
the information processing method further comprises
receiving through the antenna other first relative position information and other second relative position information of a target object both transmitted from a transmitter of the target object, a combination of the antenna and the transmitter having a maximum communication distance R within which the other first relative position information and the other second relative position information of the target object transmitted from the transmitter are receivable through the antenna, and the maximum communication distance R of the combination of the antenna and the transmitter meeting a condition that D is longer than 2R where D is a length of a side of the target area mesh, and
generating absolute position information of the target object, based on the first area mesh information and the second area mesh information of the information processing apparatus and the other first relative position information and the other second relative position information of the target object.

13. A non-transitory computer-readable storage medium storing a program causing a computer of an information processing apparatus having an antenna to execute a process comprising steps of:
acquiring self-position information indicating a self-position of an information processing apparatus in a target region; and
generating, on a basis of the self-position information, absolute position information including area mesh information that indicates a position of a target area mesh containing the information processing apparatus among plural area meshes defined by dividing the target region in a first direction and a second direction such that a division number in the second direction varies for each dividing position in the first direction in the target region, and relative position information that indicates a position of the information processing apparatus in the target area mesh, wherein
the absolute position information includes
first absolute position information that indicates an absolute position of the information processing apparatus in the first direction in the target region, the first absolute position information including first area mesh information that indicates a position of the target area mesh in the first direction in the target region and first relative position information that indicates a position of the information processing apparatus in the first direction in the target area mesh, and
second absolute position information that indicates an absolute position of the information processing apparatus in the second direction in the target region, the second absolute position information including second area mesh information that indicates a position of the target area mesh in the second direction in the target region and second relative position information that indicates a position of the information processing apparatus in the second direction in the target area mesh, and wherein
the process further comprises steps of
receiving through the antenna other first relative position information and other second relative position information of a target object both transmitted from a transmitter of the target object, a combination of the antenna and the transmitter having a maximum communication distance R within which the other first relative position information and the other second relative position information of the target object transmitted from the transmitter are receivable through the antenna, the maximum communication distance R of the combination of the antenna and the transmitter meeting a condition that D is longer than 2R where D is a length of a side of the target area mesh, and
generating absolute position information of the target object, based on the first area mesh information and the second area mesh information of the information processing apparatus and the other first relative position information and the other second relative position information of the target object.

* * * * *